United States Patent
Wu et al.

(10) Patent No.: US 9,632,134 B2
(45) Date of Patent: Apr. 25, 2017

(54) GENERATING PROBING MAP INCLUDING TOUCHDOWNS FREE OF DISABLED PROBING SITE

(71) Applicant: TAIWAN SEMICONDUCTOR MANUFACTURING COMPANY LTD., Hsinchu (TW)

(72) Inventors: Jing-Cheng Wu, New Taipei (TW); Kai-Sheng Chang, Tainan (TW); Ming-Shan Shih, Kaohsiung (TW); Yu-Chih Lee, Tainan (TW); Feng-Cheng Chiang, Tainan (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 69 days.

(21) Appl. No.: 14/713,478

(22) Filed: May 15, 2015

(65) Prior Publication Data
US 2016/0334461 A1   Nov. 17, 2016

(51) Int. Cl.
*G01R 31/28* (2006.01)
*G01R 1/073* (2006.01)

(52) U.S. Cl.
CPC ..... *G01R 31/2834* (2013.01); *G01R 1/07342* (2013.01)

(58) Field of Classification Search
None
See application file for complete search history.

(56) References Cited

U.S. PATENT DOCUMENTS

2005/0021273 A1* 1/2005 Dorough ............ G01R 31/2831 702/119

\* cited by examiner

*Primary Examiner* — Paresh Patel
(74) *Attorney, Agent, or Firm* — WPAT, P.C., Intellectual Property Attorneys; Anthony King

(57) ABSTRACT

A wafer is probed using a probe card including a plurality of probing sites following a first probing map in which touchdowns of the probe card involve the plurality of probing sites to identify faulty locations. Whether at least one faulty site exists is determined based on the faulty locations. When the at least one faulty site exists, a second probing map in which each touchdown is free of at least one disabled probing site including the at least one faulty site is obtained. The second probing map is selected when a first criterion formed using a first touchdown count (TDC) in the first probing map, a second TDC in the second probing map, a third TDC based on re-probing the faulty locations and a fourth TDC based on re-probing a portion of the faulty locations not induced by the at least one faulty site is met.

20 Claims, 20 Drawing Sheets

1002

1004

1006

GENERATING PROBING MAP INCLUDING TOUCHDOWNS FREE OF DISABLED PROBING SITE

BACKGROUND

In integrated circuit manufacturing, an automatic test equipment (ATE) performs testing on groups of device under tests (DUT) of a wafer in sequence. The ATE is configured with a probe card that has probing sites. The probing sites are configured with probes to be in contact with the groups of DUTs in sequence of touchdowns following a probing map. In each touchdown of the probing sites, the ATE is allowed to apply stimuli to and analyze response from the group of DUTs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
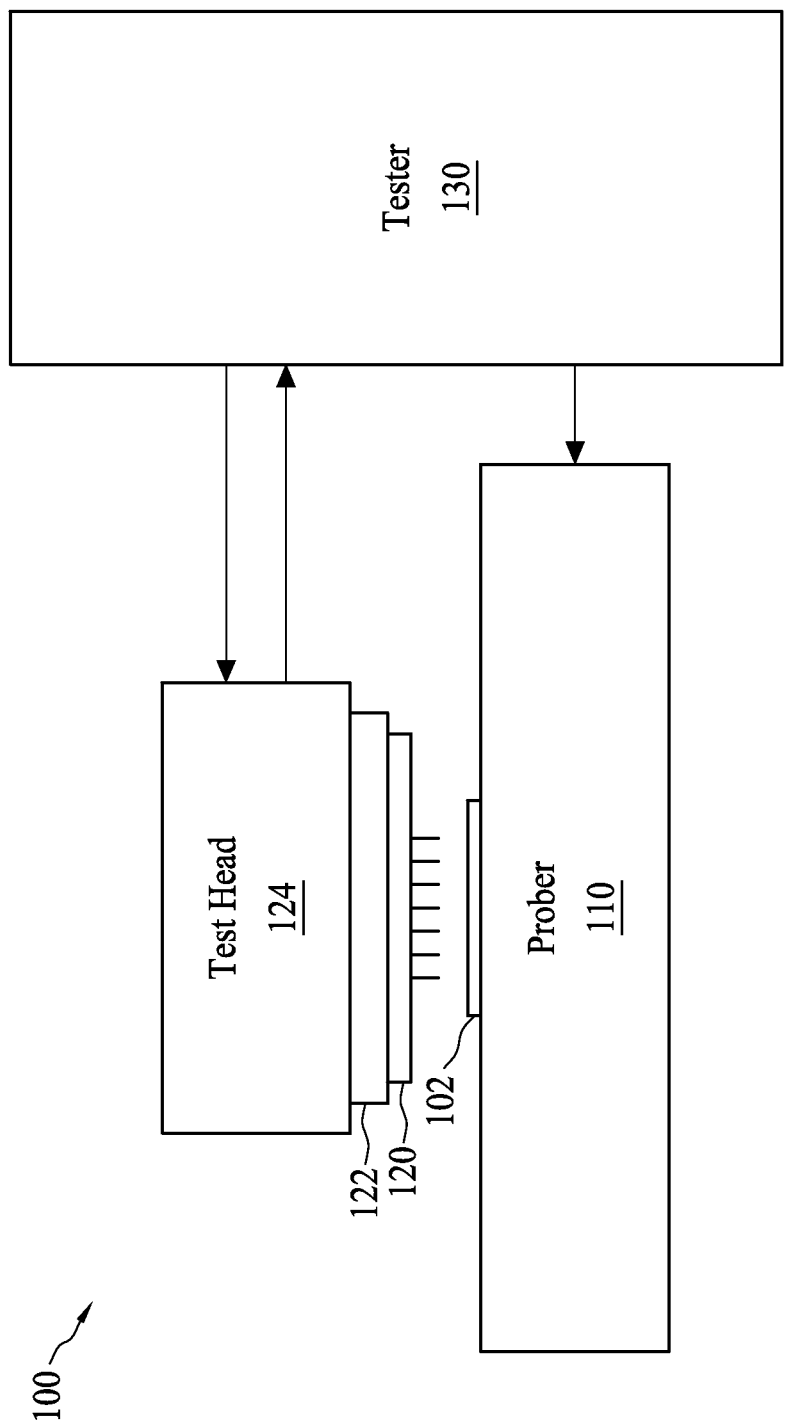
FIG. 1 is a schematic diagram of an ATE system in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top", "bottom", "front", "back", "left", "right", "horizontal", "vertical" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Some embodiments have one or a combination of the following features and/or advantages. In some embodiments, when at least one faulty site exists in a probe card including a plurality of probing sites, a total touchdown count for probing a wafer using a first probing map in which touchdowns of the probe card involve the plurality of probing sites and a total touchdown count for probing the wafer using a second probing map in which each touchdown of the probe card is free of at least one disabled probing site including the at least one faulty site are compared to determine whether to use the first probing map or the second probing map to probe a next wafer. In some embodiments, the second probing map is selected from a plurality of third probing maps corresponding to different combinations of the at least one disabled probing site. In some embodiments, the total touchdown count includes touchdowns for probing the wafer initially and touchdowns for re-probing locations in the wafer identified as faulty during probing the wafer initially. Therefore, the number of total touchdown counts for probing the next wafer is reduced.

FIG. 1 is a schematic diagram of an ATE system 100 in accordance with some embodiments. In some embodiments, the ATE system 100 performs multi-site testing on groups of DUTs of a wafer 102 in sequence. In some embodiments, the ATE system 100 includes a prober 110, a probe card 120, a pogo tower 122, a test head 124 and a tester 130. The prober 110 holds the wafer 102 and is configured with motor means to move in three directions along three axes x, y and z. For multi-site testing, the probe card 120 is configured with a plurality of probing sites and each probing site is configured with probes. For testing of one group of DUTs of the wafer 102, pads of the group of DUTs of the wafer 102 are brought into contact with the probes of the plurality of probing sites of the probe card 120 by movements of the prober 110. Each contact of one group of DUTs of the wafer 102 with the probes of the probe card 120 is referred to as a touchdown of the probe card 120. The pogo tower 122 includes spring loaded pins for providing reliable electrical connections between the probe card 120 and the test head 124. The test head 124 is configured to apply stimuli to and collect response from the group of DUTs of the wafer 102. The tester 130 is configured to generate a probing map and control a moving trajectory of the prober 110 such that a touchdown sequence of the probe card 120 follows the first probing map, and to generate the stimuli sent to and analyze the response received from the test head 124 during each touchdown of the probe card 120.

In some embodiments, after the tester 130 sequences through the wafer 102 following the probing map, faulty locations on the wafer 102 are identified. The faulty locations are locations of DUTs on the wafer 102 that do not produce expected responses when receiving the stimuli and therefore fail the tests. The tester 130 is further configured to cause the faulty locations on the wafer 102 to be re-probed. For re-probing the faulty locations, each touchdown of the probe card 120 involves one of the probing sites made in contact with the DUT at one of the faulty locations. Therefore, the number of re-probing touchdowns of the probe card 120 corresponds to the number of faulty locations. Other numbers of probing sites involved in each re-probing touchdown are within the contemplated scope of the present disclosure.

In some embodiments, each faulty location on the wafer 102 is caused by a faulty site in the plurality of probing sites of the probe card 120 or a malfunctioned DUT of the wafer 102. When at least one faulty site exists in the plurality of probing sites, at least one faulty location occurs for every touchdown of the probe card 120 following the first probing map. Therefore, the number of re-probing touchdowns of the probe card 120 is at least the number of touchdowns in the first probing map. In some embodiments, to reduce the number of total touchdowns of the probe card 120 including both initial touchdowns and re-probing touchdowns, the tester 130 generates the probing map by generating a first probing map in which each touchdown involves all of the plurality of probing sites, generating a plurality of second probing maps in each of which each touchdown is free of a respective combination of at least one disabled probing site, and selecting the probing map that causes the least number of total touchdowns from the first probing map and the plurality of second probing maps. One or more programs run by the tester 130 to generate the probing map are discussed in the following.

Figure 2:
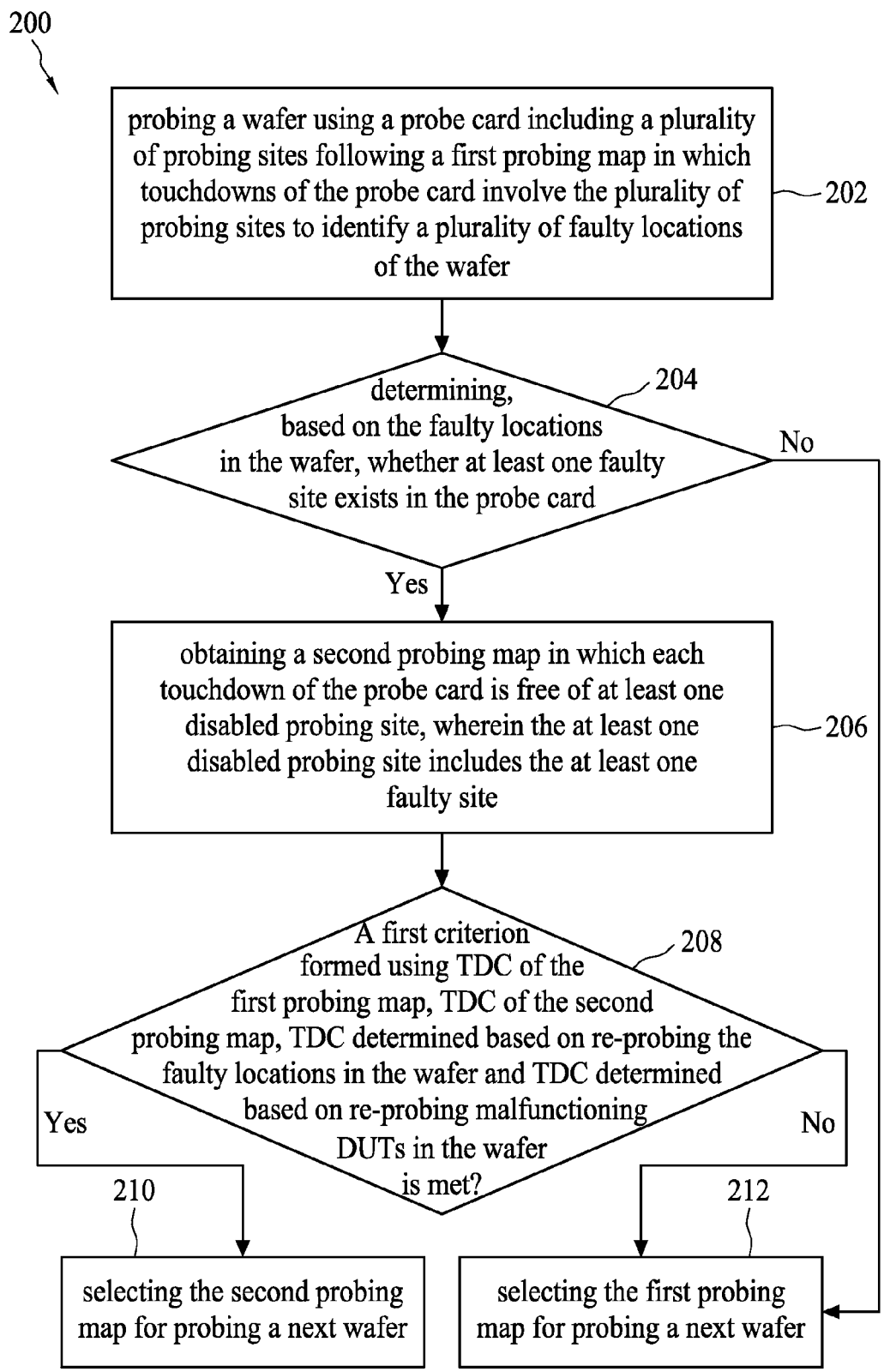
FIG. 2 is a flow diagram of a method performed by the tester in FIG. 1 for generating the probing map in accordance with some embodiments.

FIG. 2 is a flow diagram of a method 200 performed by the tester 130 in FIG. 1 for generating the probing map in accordance with some embodiments. In some embodiments, in operation 202, a wafer 102A (placed at where the wafer 102 is placed in FIG. 1) is probed using the probe card 120 (shown in FIG. 1) including a plurality of probing sites following the first probing map in which touchdowns of the probe card 120 involve the plurality of probing sites to identify a plurality of faulty locations in the wafer 102A. In operation 204, whether at least one faulty site exists in the probe card 120 is determined based on the plurality of faulty locations in the wafer 102A. If so, the method 200 proceeds to operation 206 and if not, the method proceeds to operation 212. In operation 206, a second probing map in which each touchdown of the probe card 120 is free of at least one disabled probing site is obtained. The at least one disabled probing site includes the at least one faulty site. In operation 208, a first criterion formed using a first touchdown count (TDC) of the first probing map, a second TDC of the second probing map, a third TDC determined based on re-probing the faulty locations in the wafer 102A and a fourth TDC determined based on re-probing the malfunctioning DUTs in the wafer 102A is evaluated. If the first criterion is met, the method 200 proceeds to operation 210, and if the first criterion is not met, the method 200 proceeds to operation 212. In operation 210, the second probing map is selected for probing a next wafer 102B (placed at where the wafer 102 is placed in FIG. 1). In operation 212, the first probing map is selected for probing a next wafer 102B.

Figure 3:
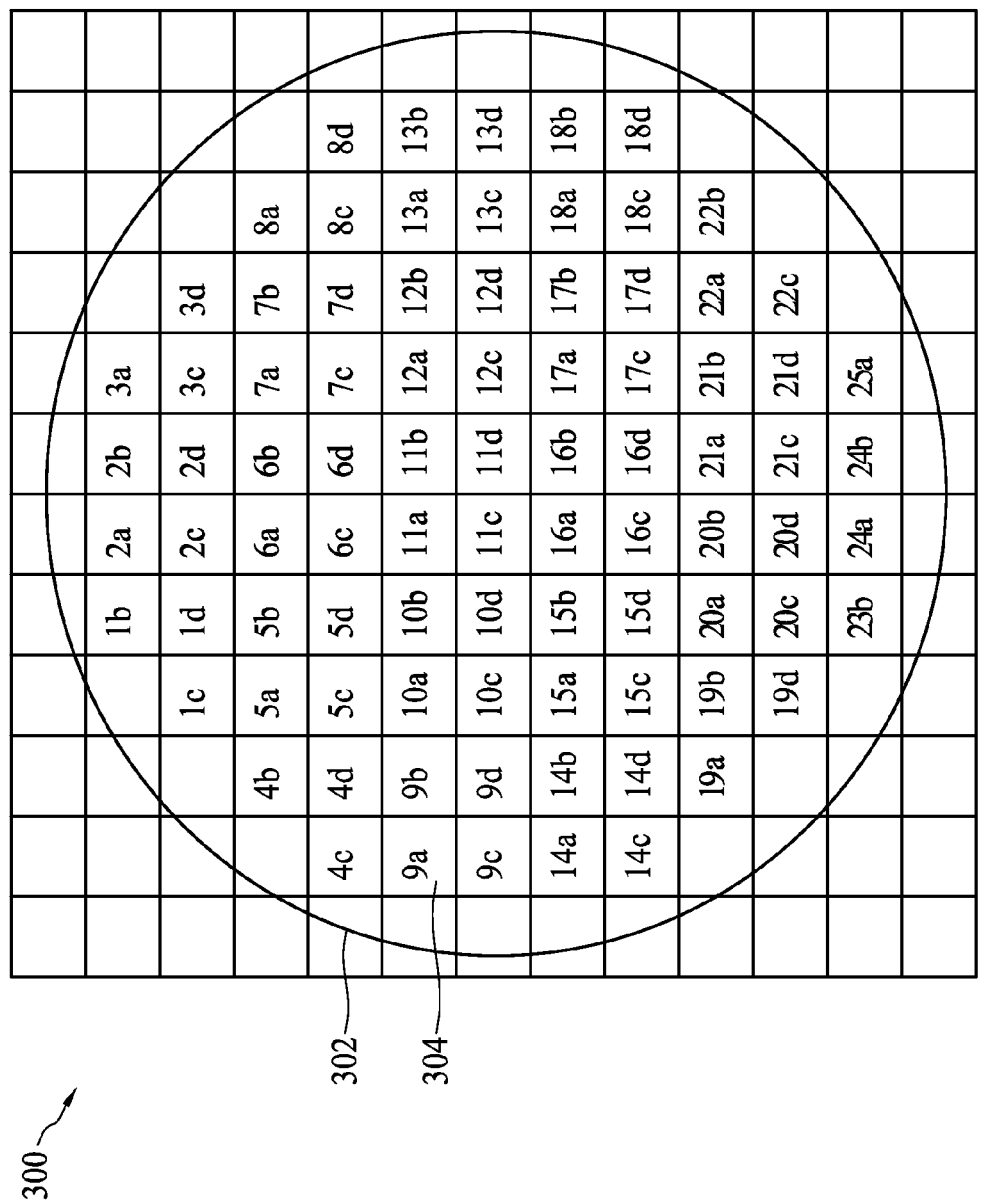
FIG. 3 is a diagram of the first probing map in operation 202 in FIG. 2 in accordance with some embodiments.

FIG. 3 is a diagram of the first probing map 300 in operation 202 in FIG. 2 in accordance with some embodiments. In operation 202, the wafer 102A is probed using the probe card 120 including the plurality of probing sites "a", "b", "c" and "d" following the first probing map 300 in which touchdowns (e.g. $2^{nd}$, $5^{th}$ touchdowns) of the probe card 120 involves the plurality of probing sites "a", "b", "c" and "d". The first probing map 300 includes a wafer 302 that includes DUTs (DUT 304 is labeled as an example). In each DUT (e.g. 304), a corresponding number and alphabet indicate that the DUT 304 at the corresponding location is probed during a touchdown performed in a place of a sequence specified by the number, and by a probing site of the probe card 120 specified by the alphabet. For example, the DUT 304 labeled with "9a" indicates the DUT 304 at the location where "9a" is labeled is probed during the $9^{th}$ touchdown and by the probing site "a".

In the example in FIG. 3, the probe card 120 includes four probing sites "a", "b", "c" and "d". For each touchdown (the $1^{st}$, $2^{nd}$, . . . or $25^{th}$ touchdown) of the probe card 120, all of the four probing sites "a", "b", "c" and "d" are enabled. For touchdowns that do not cross an edge of the wafer 302, such as the $2^{nd}$ touchdown, the $5^{th}$ touchdown and so on, all of the four probing sites "a", "b", "c", and "d" are involved to probe DUTs at four locations on the wafer 302. For touchdowns that cross the edge of the wafer 302, such as the $1^{st}$ touchdown, $3^{rd}$ touchdown and so on, some but not all of the four probing sites "a", "b", "c", and "d" are involved to probe DUTs on the wafer 302.

In operation 202, the tester 130 causes the prober 110 to move the wafer 102A for the $1^{st}$, $2^{nd}$, . . . and $25^{th}$ touchdowns in the first probing map 300 to be performed in sequence. During each touchdown (the $1^{st}$, $2^{nd}$, . . . , or $25^{th}$ touchdown) of the probe card 120, probes of the plurality of probing sites "a", "b", "c" and "d" are made in contact with corresponding DUTs in the wafer 102A so that tester 130 can send stimuli to the DUTs and collect responses from the DUTs. Based on responses collected as the tester 130 sequence through the $1^{st}$, $2^{nd}$, . . . and $25^{th}$ touchdowns in the first probing map 300, the tester 130 identifies the faulty locations in the wafer 102A.

Figure 4:
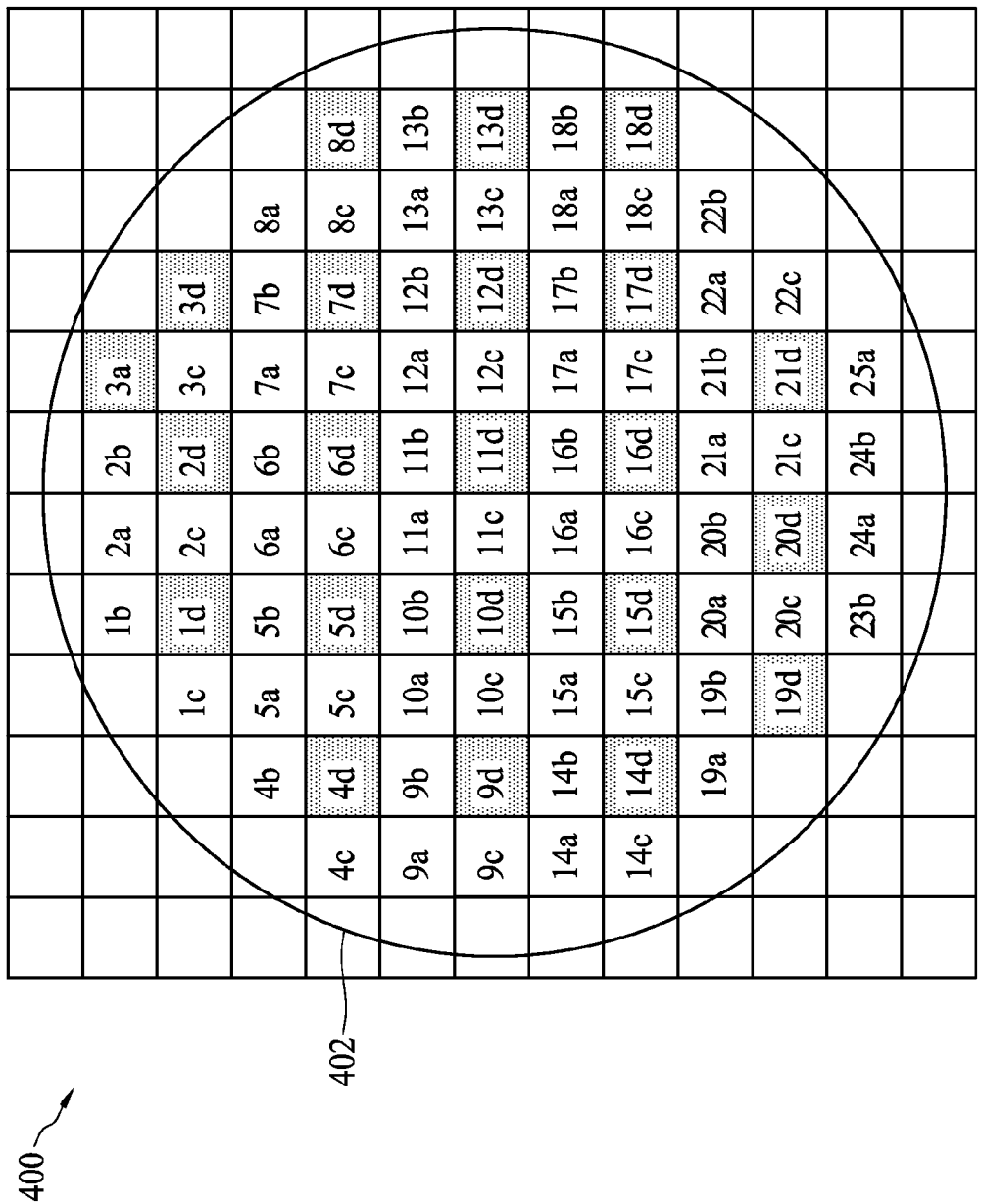
FIG. 4 is a diagram of a wafer map in which faulty locations of the wafer are identified in accordance with some embodiments.

FIG. 4 is a diagram of a wafer map 400 in which faulty locations of the wafer 102A are identified in accordance with some embodiments. The wafer map 400 includes a wafer 402 corresponding to the wafer 102A being probed. In the wafer map 400, DUTs in the wafer 402 corresponding to DUTs at faulty locations in the wafer 102A are shaded. For example, based on the wafer map 400, faulty locations in the wafer 102A include locations where "3a", "1d", "2d", . . . and "21d" are labeled.

In operation 204, whether at least one faulty site exists in the probe card 120 is determined based on the faulty locations in the wafer 102A. In some embodiments, by identifying a repetitive faulty pattern in touchdowns that do not cross the edge of the wafer 402 in the wafer map 400, the tester 130 determines the existence of the at least one faulty site. For example, the tester 130 analyzes the faulty locations at where "3a", "1d", "2d" . . . and "21d" are labeled in the wafer map 302 and finds that in each of the touchdowns that do not cross the edge of the wafer 402 such as the $2^{nd}$, $5^{th}$, $6^{th}$, . . . and $21^{st}$ touchdowns, a location corresponding to the probing site "d" is faulty. Therefore, the tester 130 determines that the probing site "d" is faulty. In addition, in some embodiments, the tester 130 further determines the faulty locations not induced by the faulty site "d", such as the faulty location at where "3a" is labeled, are where the malfunctioned DUTs are located.

Figure 5:
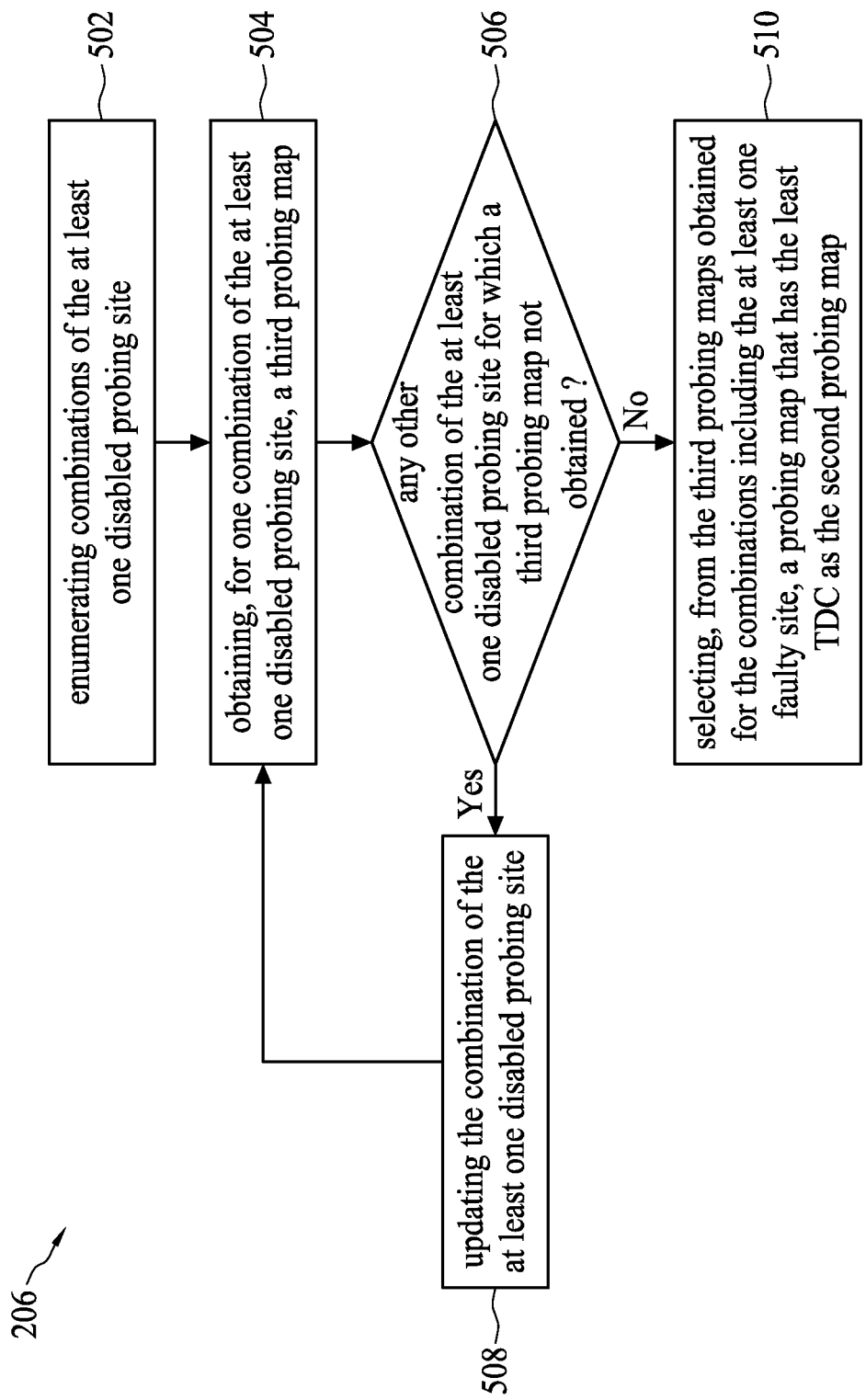
FIG. 5 is a flow diagram of a method for performing the operation 206 in FIG. 2 in accordance with some embodiments.

FIG. 5 is a flow diagram of a method for performing the operation 206 in FIG. 2 in accordance with some embodiments. In operation 206, a second probing map in which each touchdown of the probe card 120 is free of at least one disabled probing site is obtained. The at least one disabled probing site includes the at least one faulty site. In FIG. 5, in operation 502, combinations of the at least one disabled probing site are enumerated. In operation 504, for one combination of the at least one disabled probing site, a third probing map is obtained. In operation 506, whether there is any other combination of the least one disabled probing site for which a third probing map is not obtained is determined. If so, the method proceeds to operation 508, and if not, the method proceeds to operation 510. In operation 508, the combination of the at least one disabled probing site is updated. Then, the method loops back to operation 504 to obtain a third probing map for the updated combination of the at least one disabled probing site. In operation 510, a probing map that has the least TDC is selected from the third probing maps obtained for the combinations including the at least one faulty site as the second probing map.

Figure 6:
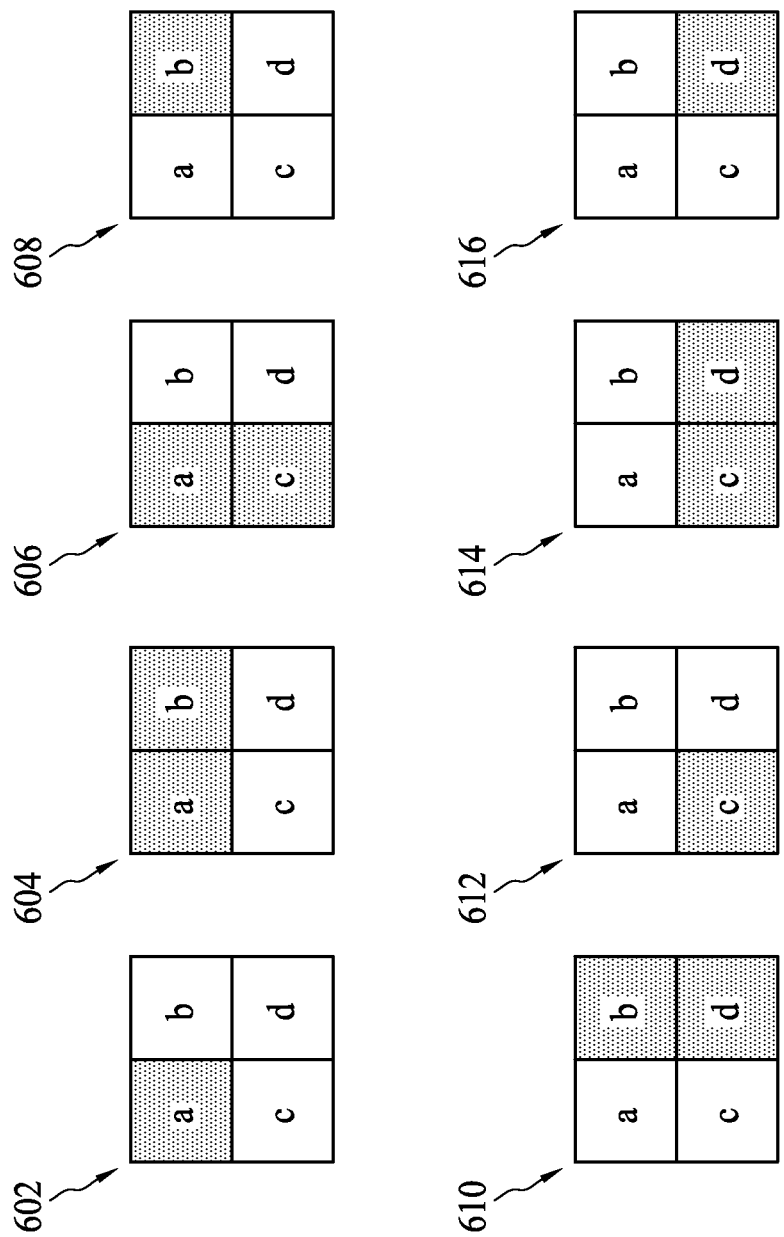
FIG. 6 is a diagram of different combinations of the at least one disabled probing site of the probe card with four probing sites in accordance with some embodiments.

FIG. 6 is a diagram of different combinations 602, 604, . . . and 616 of the at least one disabled probing site of the probe card 120 with four probing sites in accordance with some embodiments. In operation 502, combinations 602, 604, . . . and 616 of the at least one disabled probing site are enumerated. In some embodiments, the enumerated combinations 602, 604, . . . and 616 include those each with the at least one disabled probing site that is less than or equal to a percentage of a total number of probing sites in number and contiguous in shape. For example, in FIG. 6, the probe card 120 (shown in FIG. 1) has four probing sites "a", "b", "c" and "d". For the combination 602, the probing site "a" is disabled. For the combination 604, the probing sites "a" and "b" are disabled. For the combination 606, the probing sites "a" and "c" are disabled. For the combination 608, the probing site "b" is disabled. For the combination 610, the probing sites "b" and "d" are disabled. For the combination 612, the probing site "c" is disabled. For the combination 614, the probing sites "c" and "d" are disabled. For the combination 616, the probing site "d" is disabled. Therefore, the numbers of the at least one disabled probing site for the combinations 602, 604, . . . and 616 are less than or equal to 50% of the total number of probing sites, and the shapes of the at least one disabled probing site for the combinations 602, 604, . . . and 616 are rectangles with different sizes, which are contiguous.

Figure 7:
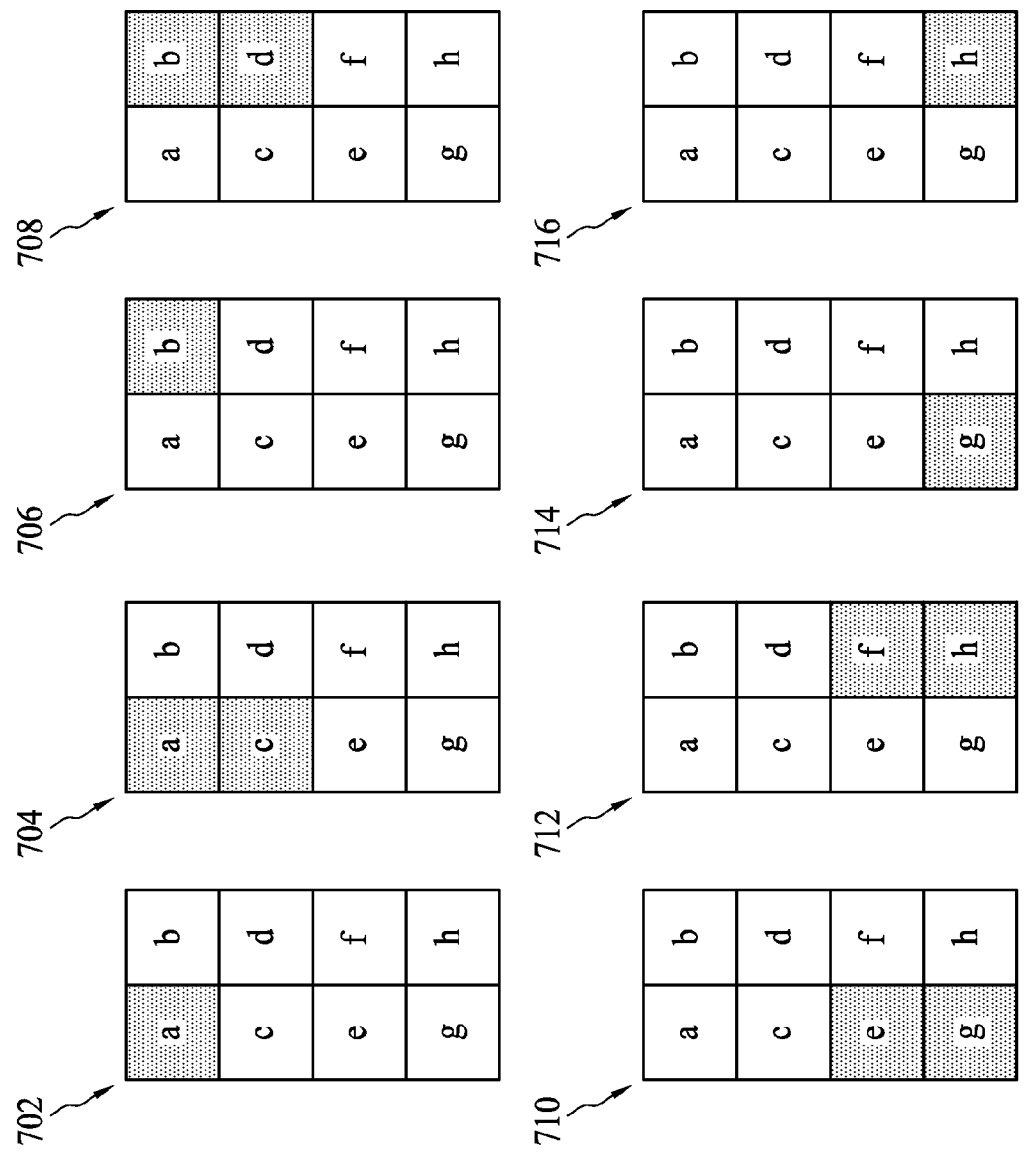
FIG. 7 is a diagram of different combinations of the at least one disabled probing site of the probe card with eight probing sites in accordance with some embodiments.

FIG. 7 is a diagram of different combinations 702, 704, . . . and 716 of the at least one disabled probing site of the probe card 120 with eight probing sites in accordance with some embodiments. In some embodiments, the enumerated combinations 702, 704, . . . and 716 include those each with the at least one disabled probing site that is less than or equal to a percentage of a total number of probing sites in number and forms a corner block of the entire block of probing sites. For example in FIG. 7, the probe card 120 (shown in FIG. 1) has eight probing sites "a", "b", . . . and "h". For the combination 702, the probing site "a" is disabled. The disabled probing site "a" forms a top left corner block of the entire block of probing sites "a", "b", . . . and "h". For the combination 704, the probing sites "a" and "c" are disabled. The disabled probing sites "a" and "c" form a top left corner block of the entire block of probing sites "a", "b", . . . and "h". For the combination 706, the probing site "b" is disabled. The disabled probing site "b" forms a top right corner block of the entire block of probing sites "a", "b", . . . and "h". For the combination 708, the probing sites "b" and "d" are disabled. The disabled probing sites "b" and "d" form a top right corner block of the entire block of probing sites "a", "b", . . . and "h". For the combination 710, the probing sites "e" and "g" are disabled. The disabled probing sites "e" and "g" form a lower left corner block of the entire block of probing sites "a", "b", . . . and "h". For the combination 712, the probing sites "f" and "h" are disabled. The disabled probing sites "f" and "h" form a lower right corner block of the entire block of probing sites "a", "b", . . . and "h". For the combination 714, the probing site "g" is disabled. The disabled probing site "g" forms a lower left corner block of the entire block of probing sites "a", "b", . . . and "h". For the combination 716, the probing site "h" is disabled. The disabled probing site "h" forms a lower right corner block of the entire block of probing sites "a", "b", . . . and "h". Therefore, the numbers of the at least one disabled probing site for the combinations 702, 704, . . . and 716 are less than or equal to 25% of the total number of probing sites, and the blocks of the at least one disabled probing site for the combinations 702, 704, . . . and 716 are located at corners of the entire block of probing sites "a", "b", . . . and "h"

Figure 8:
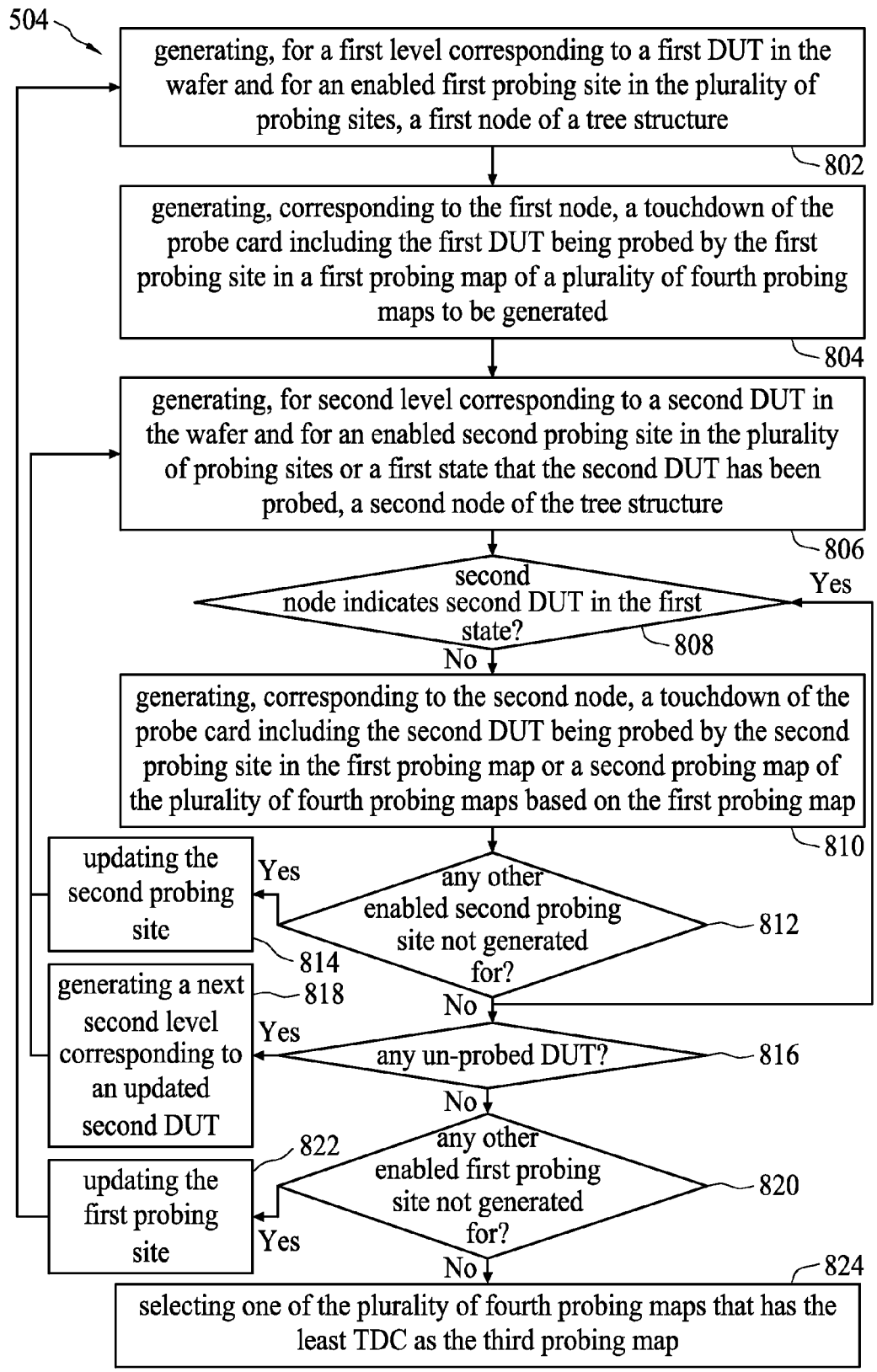
FIG. 8 is a flow diagram of a method for performing the operation 504 in FIG. 5 in accordance with some embodiments.

FIG. 8 is a flow diagram of a method for performing the operation 504 in FIG. 5 in accordance with some embodiments. In operation 504, for one combination of the at least one disabled probing site, a third probing map is obtained. For obtaining the third probing map, a tree structure in which each level represents a DUT in the wafer 102A and each node in the level represents a different probing site in the plurality of probing sites probing the DUT or a state that the DUT has been probed along with another DUT in a level upper than that of the DUT is generated. A plurality of fourth probing maps each of which corresponds to a path from a root node to a leaf node in the tree structure are generated. One of the plurality of fourth probing maps that has the least TDC is selected as the third probing map. The method in FIG. 8 illustrates steps for generating each node in the tree structure and generating each fourth probing map.

In operation 802, for a first level corresponding to a first DUT in the wafer 102A and for an enabled first probing site in the plurality of probing sites, a first node of a tree structure is generated. In operation 804, corresponding to the first node, a touchdown of the probe card including the first DUT being probed by the first probing site is generated in a first probing map of a plurality of fourth probing maps to be generated. In operation 806, for a second level corresponding to a second DUT in the wafer 102A and for an enabled second probing site in the plurality of probing sites or a first state that the second DUT has been probed, a second node of the tree structure is generated. In operation 808, whether the second node indicates that the second DUT is in the first state is determined. If so, the method proceeds to operation 816, and if not, the method proceeds to operation 810. In operation 810, corresponding to the second node, a touchdown of the probe card 120 including the second DUT being probed by the second probing site is generated in the first probing map of the plurality of fourth probing maps or a second probing map of the plurality fourth probing maps based on the first probing map. In operation 812, whether there is any other enabled second probing site for which a touchdown including the second DUT being probed by the other second probing site is not generated is determined. If so, the method proceeds to operation 814, and if not, the method proceeds to operation 816. In operation 814, the second probing site is updated to be the other enabled second probing site in the plurality of probing sites. Then the method loops back to operation 806 to generate another second node for the same second DUT probed using the updated second probing site. In operation 816, whether there is any un-probed DUT exists in the wafer 102A is determined. If so, the method proceeds to operation 818, and if not the method proceeds to operation 820. In operation 818, the second DUT is updated to be the un-probed DUT and a next second level is generated corresponding to the updated second DUT. In addition, the enabled second probing site in the plurality of probing sites for which another second node is to be generated is reset to start from a beginning second probing site in the plurality of probing sites. Then the method loops back to the operation 806 to generate the other second node in the next second level. In operation 820, whether there is any other enabled first probing site for which a touchdown including the first DUT being probed by the other first probing site is not generated is determined. In so, the method proceeds to operation 822, and if not the method proceeds to operation 824. In operation 822, the first probing site is updated to be the other enabled first probing site in the plurality of probing sites. Then the method loops back to operation 802 to generate another first node using the updated first probing site. In operation 824, one of the plurality of fourth probing maps that has the least TDC is selected as the third probing map.

Figure 9:
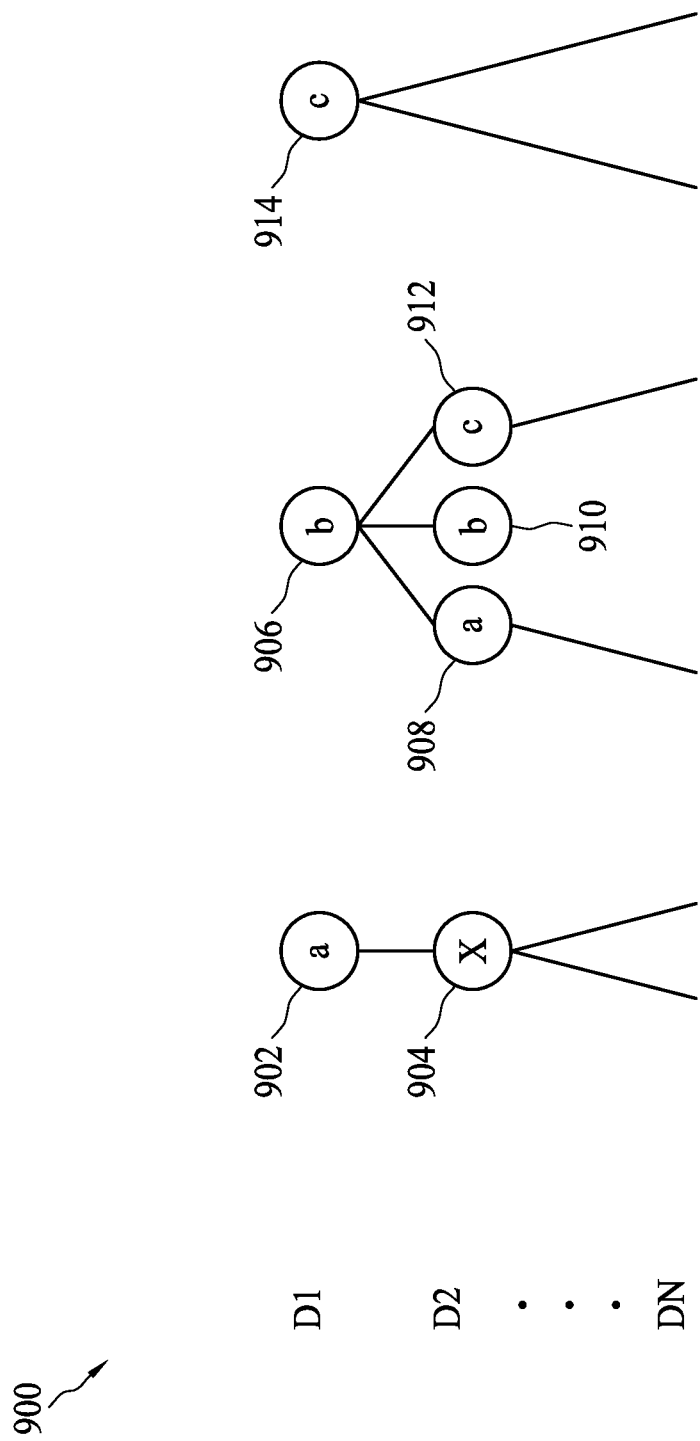
FIG. 9 is diagram of a tree structure in the method in FIG. 8 in accordance with some embodiments.
Figure 10:
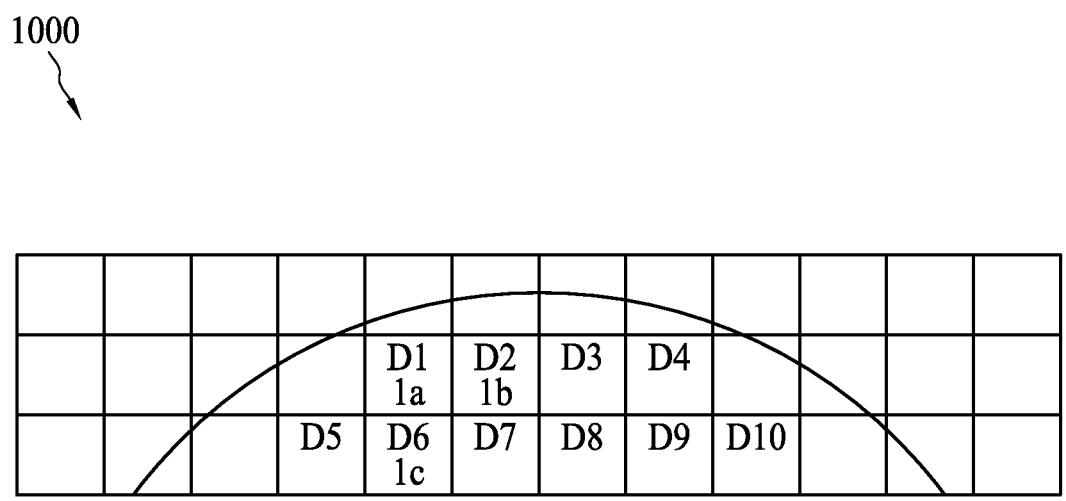
FIGS. 10 and 11 are diagrams of partial fourth probing maps in the method in FIG. 8 in accordance with some embodiments.
Figure 11:
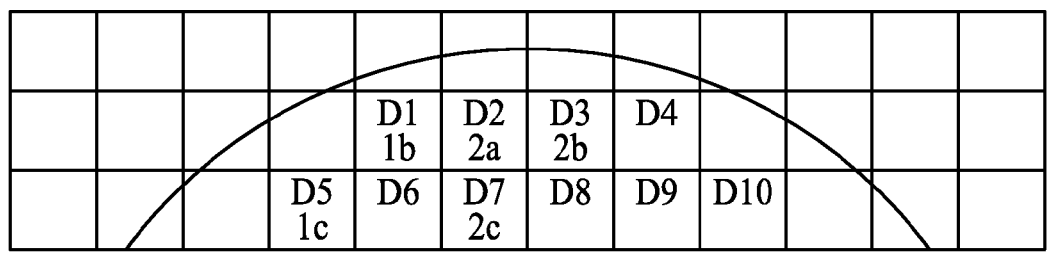
Figure 11:
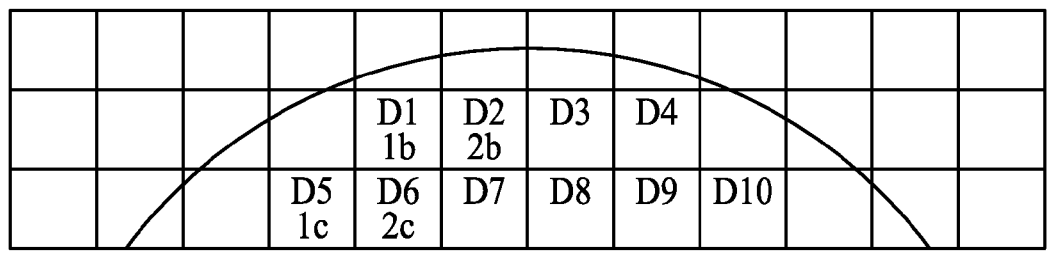
Figure 11:
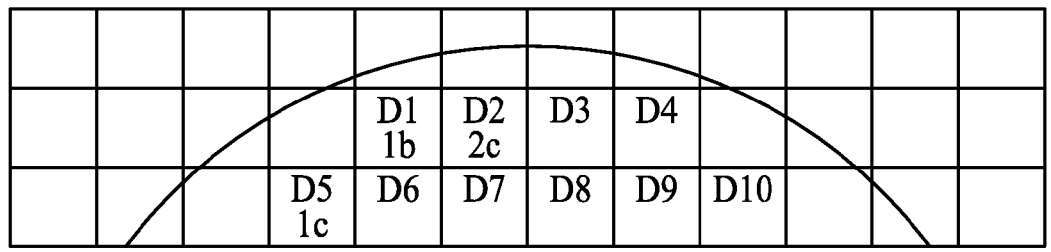

FIG. 9 is diagram of a tree structure 900 in the method in FIG. 8 in accordance with some embodiments. FIGS. 10 and 11 are diagrams of partial fourth probing maps 1000, 1002, 1004 and 1006 in the method in FIG. 8 in accordance with some embodiments. Referring to FIG. 5, suppose in the current iteration, a third probing map for the combination 616 (shown in FIG. 6) that has the disabled probing site "d" is obtained in operation 504. Therefore, the probing sites "a", "b" and "c" are enabled.

Referring to FIG. 9, in operation 802, for a first level D1 corresponding to a first DUT D1 in the wafer 102A and for an enabled first probing site "a" in the plurality of probing sites "a", "b", "c" and "d", a first node 902 of the tree structure 900 is generated. The first node 902 is a root node in the tree structure 900.

Referring to FIG. 10, in operation 804, corresponding to the first node 902 (in FIG. 9), a touchdown (the $1^{st}$ touchdown) of the probe card 120 including the first DUT D1 being probed by the first probing site "a" is generated in a first probing map 1000 of a plurality of fourth probing maps to be generated. In the $1^{st}$ touchdown in the first probing map 1000, DUTs D1, D2 and D6 are to be probed by the probing sites "a", "b" and "c", respectively.

Referring to FIG. 9, in operation 806, for a second level D2 corresponding to a second DUT D2 in the wafer 102A and for a first state "X" that the second DUT D2 has been probed, a second node 904 of the tree structure 900 is generated. Since in the first probing map 1000 in FIG. 10, the second DUT D2 has been probed by the probing site "b" in the $1^{st}$ touchdown, the second node 904 indicating that the second DUT D2 is in the first state "X" is generated.

Referring to FIG. 9, in operation 808, whether the second node 904 is in the first state "X" is determined. If so, the method proceeds to operation 816. In operation 816, whether there is any un-probed DUT (such as D3, D4, D5 and so on) exists in the wafer 102A is determined. If so, the method proceeds to operation 818. In operation 818, the second DUT is updated to be the un-probed DUT (such as D3) and a next second level (such as D3) is generated corresponding to the updated second DUT (such as D3). In addition, the enabled second probing site for which another second node is to be generated is reset to start from a beginning second probing site "a" in the plurality of probing sites "a", "b", "c" and "d". Then the method loops back to operation 806 to generate the other second node in the next second level (such as D3). The method continues to generate next second levels corresponding to un-probed DUTs until a second level corresponding to a last DUT DN in the wafer 102A has been generated. Second nodes generated in the second level DN are leaf nodes of the tree structure 900. Then the method loops back to operation 802 to generate another first node 906 for another enabled probing site "b" in the first level D1.

Referring to FIG. 9, in operation 802, for the first level D1 corresponding to the first DUT D1 in the wafer 102A and for the enabled probing site "b" in the plurality of probing sites "a", "b", "c" and "d", the first node 906 of the tree structure 900 is generated. The first node 906 is another root node in the tree structure 900.

Referring to FIG. 11, in operation 804, corresponding to the first node 906 (in FIG. 9), a touchdown (the $1^{st}$ touchdown) of the probe card 120 including the first DUT D1 being probed by the first probing site "b" is generated in a first probing map 1002 of a plurality of fourth probing maps to be generated. In the $1^{st}$ touchdown generated in the first probing map 1002, DUTs D1 and D5 are to be probed by the probing sites "b" and "c", respectively.

Referring to FIG. 9, in operation 806, for a second level D2 corresponding to a second DUT D2 in the wafer 102A and for an enabled second probing site "a" in the plurality of probing sites "a", "b", "c" and "d", a second node 908 of the tree structure 900 is generated. Since in the first probing map 1002, the second DUT D2 has not been probed in the $1^{st}$ touchdown, the second node 908 indicating that the second DUT D2 is to be probed by the second probing site "a" is generated. In operation 808, whether the second node 908 is in the first state "X" is determined. If not, the method proceeds to operation 810.

Referring to FIG. 11, in operation 810, corresponding to the second node 908, a touchdown (the $2^{nd}$ touchdown) of the probe card 120 including the second DUT D2 being probed by the second probing site "a" is generated in the first probing map 1002 of the plurality of fourth probing maps. In the $2^{nd}$ touchdown generated in the first probing map 1002, DUTs D2, D3 and D7 are to be probed by the probing sites "a", "b" and "c", respectively.

In operation 812, whether there is any other enabled second probing site (such as "b") for which a touchdown including the second DUT D2 being probed by the second probing site (such as "b") is not generated is determined. If so, the method proceeds to operation 814. In operation 814, the second probing site is updated to be the other enabled second probing site "b" in the plurality of the probing sites "a", "b", "c" and "d". Then the method loops back to operation 806.

Referring to FIG. 9, in operation 806, for the second level D2 corresponding to the second DUT D2 in the wafer 102A and for the enabled second probing site "b" in the plurality of probing sites "a", "b", "c" and "d", a second node 910 of the tree structure 900 is generated. In operation 808, whether the second node 910 is in the first state "X" is determined. If not, the method proceeds to operation 810.

Referring to FIG. 10, in operation 810, corresponding to the second node 910, a touchdown (the $2^{nd}$ touchdown) of the probe card 120 including the second DUT D2 being probed by the second probing site "b" is generated in a second probing map 1004 of the plurality of fourth probing maps based on the first probing map 1002. In the second probing map 1004, the $1^{st}$ touchdown corresponds to the $1^{st}$ touchdown in the first probing map 1002. In the $2^{nd}$ touchdown in the second probing map 1004, DUTs D2 and D6 are to be probed by the probing sites "b" and "c", respectively.

The method continues to generate another second node 912 for the second DUT D2 being probed by another enabled probing site "c" and another second probing map 1006 in which the $1^{st}$ touchdown corresponds to the $1^{st}$ touchdown in the first probing map 1002 and the $2^{nd}$ touchdown includes the DUT D2 being probed by the probing site "c".

Then for operation 812, since all of the enabled second probing sites "a", "b" and "c" have been generated for, the method proceeds to operation 818 in which the second DUT is updated to the un-probed DUT (such as D3) and a next second level (such as D3) is generated corresponding to the updated second DUT (such as D3). In addition, the enabled second probing site for which another second node is to be generated is reset to start from a beginning second probing site "a" in the plurality of probing sites "a", "b", "c" and "d". Then the method loops back to operation 806 to generate in the other second node in the next second level (such as D3). The method continues to generate next second levels corresponding to un-probed DUTs until a second level corresponding to a last DUT DN in the wafer 102A has been generated. Second nodes generated in the second level DN are leaf nodes of the tree structure 900. Then the method loops back to operation 802 to generate another first node 914 for another enabled probing site "c" in the first level D1.

Similar to the first nodes 902 and 906, paths from the root node 914 to various leaf nodes are generated, and corresponding fourth probing maps are also generated. Then for operation 820, since for the first DUT D1, all of the enabled first probing sites "a", "b" and "c" have been generated for, the method proceeds to operation 824. Each of the plurality of fourth maps corresponds to a path from one of the root nodes 902, 906 and 914 to one of the leaf nodes at the level DN. In operation 824, one of the plurality of fourth probing maps that has the least TDC is selected as the third probing map.

In the example in FIGS. 9, 10 and 11, the top level in which the root nodes 902, 906 and 914 of the tree structure 900 are generated corresponds to the DUT D1, and the $1^{st}$ touchdown in the plurality of fourth probing maps (such as 1000, 1002, 1004 and 1006) starts at the DUT D1. Other tree structures in which the top levels correspond to other DUTs different from the DUT D1 and other fourth probing maps in which the $1^{st}$ touchdown starts at other DUTs different the DUT D1 are within the contemplated scope of the present disclosure. In some embodiments, different tree structures in which the top levels correspond to different DUTs are generated, and the third probing map that has the least TDC is selected from all of the fourth probing maps generated for the different tree structures.

Referring to FIG. 5, after the third probing map is obtained for one combination (such as the combination 616 in FIG. 6) of the at least one disabled probing site is obtained, the method continues to obtain third probing maps for other combinations 602, 604, . . . and 614 through the loop including the operations 506, 508 and 504. Then, in operation 510, the method selects from the third probing maps obtained for the combinations 610, 614 and 616 including the at least one faulty site "d" a probing map that has the least TDC as the second probing map.

In the embodiments in FIG. 5, third probing maps corresponding to different combinations 610, 612, . . . and 616 that may not include the at least one faulty site "d" are obtained. This way the operation for identifying faulty locations and determining the at least one faulty site can be executed concurrently with the operation 504, 506 and 508 for generating the third probing maps. After the at least one faulty site is determined, then in operation 510, the second probing map is selected from the third probing maps corresponding to the combinations including the at least one faulty site. Other ways to generate the second probing map are within the contemplated scope of the present disclosure. For example, after the at least one faulty site is determined, then in operation 502, only combinations including the at least one faulty site "d" (such as the combinations 610, 614 and 616 in FIG. 6) are enumerated. As a result, third probing maps are obtained only for combinations 610, 614 and 616 including the at least one faulty site "d". The second probing map is therefore selected from the third probing maps corresponding to the combinations including the at least one faulty site "d". This way, fewer third probing maps are obtained.

Figure 12:
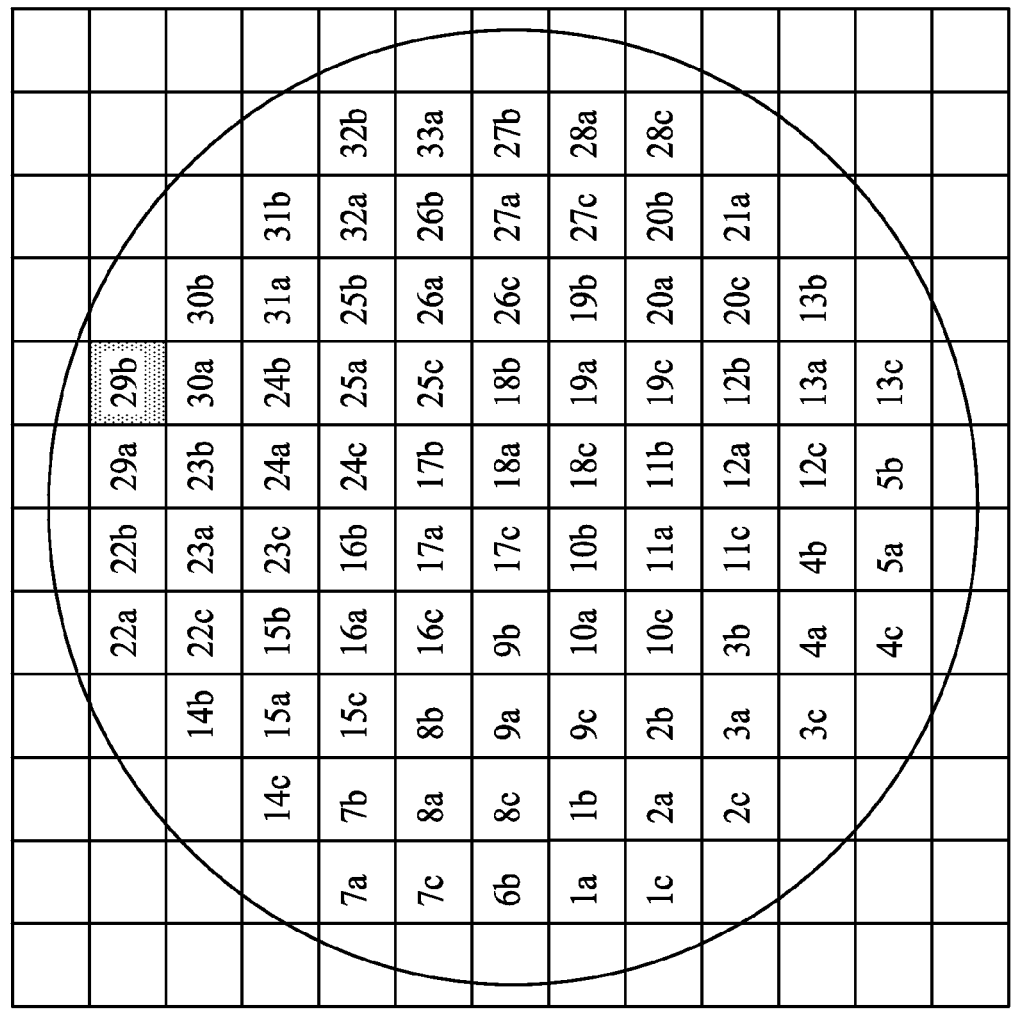
FIG. 12 is a diagram of the second probing map in operation 206 in FIG. 2 in accordance with some embodiments.

FIG. 12 is a diagram of the second probing map 1200 in operation 206 in FIG. 2 in accordance with some embodiments. In operation 208, a first criterion formed using a first TDC of the first probing map 300 (shown in FIG. 3), a second TDC of the second probing map 1200, a third TDC determined based on re-probing the faulty locations (labeled at where "$3a$", "$1d$", "$2d$" . . . and "$21d$" are located in FIG. 4) in the wafer 102A and a fourth TDC determined based on re-probing the malfunctioning DUTs (the DUT labeled with "$3a$" in FIG. 4) in the wafer 102A is evaluated. In some embodiments, the first criterion is expressed as follows:

$$FTDC-STDC+BLRTDC-BDRTDC>threshold \qquad (1)$$

wherein FTDC is the first TDC of the first probing map 300, STDC is the second TDC of the second probing map 1200, BLRTDC is the third TDC determined based on re-probing the faulty locations (labeled at where "$3a$", "$1d$", "$2d$" . . . and "$21d$" are located in FIG. 4) in the wafer 102A and BDRTDC determined on re-probing the malfunctioning DUTs (the DUT labeled with "$3a$" in FIG. 4) in the wafer 102A. As illustrated in FIG. 3, FTDC is equal to 25. As illustrated in FIG. 12, STDC is equal to 33. In some embodiments, BLRTDC is equal to a TDC for re-probing the faulty locations (labeled at where "$3a$", "$1d$", "$2d$" . . . and "$21d$" are located in FIG. 4) with one enabled probing site. As illustrated in FIG. 4, BLRTDC is equal to 22. In some embodiments, BDRTDC is equal to a TDC for re-probing the malfunctioning DUTs (the DUT labeled with "3a" in FIG. 4) in the wafer 102A with one enabled probing site. Regardless of using the first probing map 300 or the second probing map 1200 for probing the wafer 102A, the malfunctioning DUTs (the DUT labeled with "3a" in FIG. 4 and corresponding the DUT labeled with "29b" in FIG. 12) needs to be re-probed. As illustrated in both FIG. 4 and FIG. 12, BDRTDC is equal to 1. As a result, an evaluated value of the left side of expression (1) is equal to 13. In some embodiments, the threshold is equal to 0. In other embodiments, the threshold is a positive number such as 1. Therefore, expression (1) is evaluated to TURE which means the first criterion is met. If the first criterion is met, in operation 210, the second probing map 1200 is selected for probing the next wafer 102B. On the other hand, if the criterion is not met, in operation 212, the first probing map 300 is selected for probing the next wafer 102B.

As described with references to FIGS. 2 to 12, by selecting the second probing map that has the least TDC from the plurality of third probing maps corresponding to different combinations of the at least one disabled probing site, and comparing the TDC for probing and re-probing the wafer based on the first probing map and TDC for probing and re-probing the wafer based on the second probing map, the probing map that results in less TDC for probing and re-probing the next wafer is selected from the first probing map and the second probing map.

Figure 13:
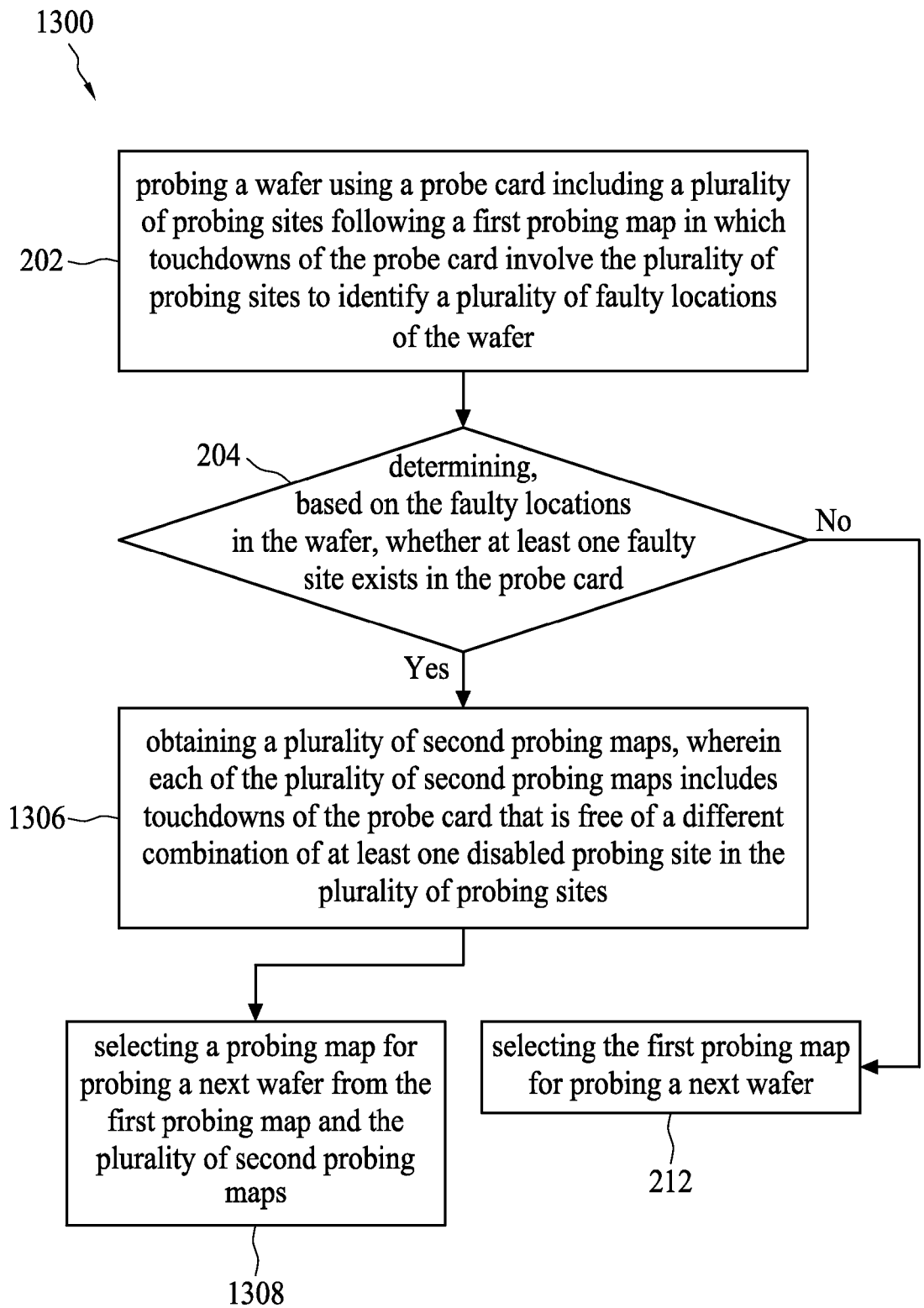
FIG. 13 is a flow diagram of a method performed by the tester in FIG. 1 for generating the probing map in accordance with other embodiments.

FIG. 13 is a flow diagram of a method 1300 performed by the tester 130 in FIG. 1 for generating the probing map in accordance with other embodiments. Compared to the method 200 in FIG. 2 which includes operations 206, 208 and 210 that select a second probing map that has the least TDC from a plurality of third probing maps for different combinations for at least one disabled probing site and selects the second probing map for probing the next wafer if the first criteria is met, the method 1300 in FIG. 13 includes operations 1306 and 1308 that are implemented in embodiments to be described with references to FIGS. 14 and 15 similarly as the operations 206, 208 and 210 in method 200, or implemented in embodiments to be described with references to FIGS. 14 and 16 differently from operations 206, 208 and 210 in method 200. The operations such as operations 202 and 204 in FIG. 13 that have the same reference numerals as the operations in FIG. 2 are the same as the operations in FIG. 2 and are omitted to be further described. In FIG. 13, in operation 202, a wafer is probed using a probe card including a plurality of probing sties following a first probing map in which touchdowns of the probe card involve the plurality of probing sites to identify a plurality of faulty locations of the wafer. In operation 204, whether at least one faulty site exists in the probe card 120 is determined based on faulty locations in the wafer 102A. If so, the method 1300 proceeds to operation 1306 and if not, the method proceeds to operation 212. In operation 212, the first probing map is selected for probing a next wafer. In operation 1306, a plurality of second probing maps are obtained. Each of the plurality of second probing maps includes touchdowns of the probe card that is free of a different combination of at least one disabled probing site in the plurality of probing sites. In operation 1308, a probing map is selected for probing a next wafer from the first probing map and the plurality of second probing maps.

Figure 14:
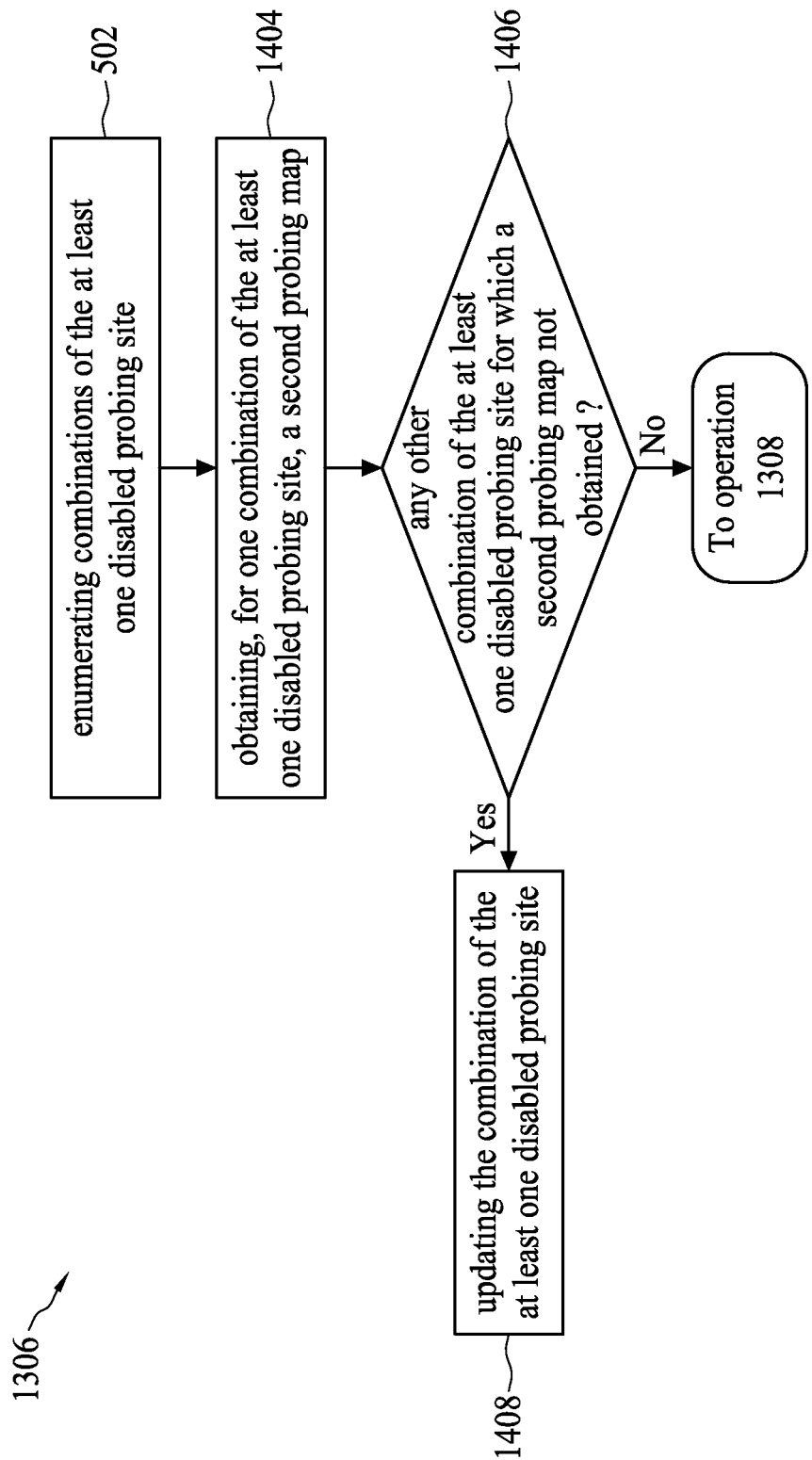
FIG. 14 is a flow diagram of a method for performing the operation 1306 in FIG. 13 in accordance with some embodiments.

FIG. 14 is a flow diagram of a method for performing the operation 1306 in FIG. 13 in accordance with some embodiments. Compared to the method for operation 206 in FIG. 5, the method for operation 1306 obtains a plurality of second probing maps for different combinations of at least one disabled probing site and proceeds to operation 1308. The operations such as operation 502 in FIG. 14 that have the same reference numerals as the operations in FIG. 5 are the same as the operations in FIG. 5 and are omitted to be further described. The operations 1404, 1406 and 1408 in FIG. 14 are corresponding to operations 504, 506 and 508 in FIG. 5, respectively. Description for the operations 504, 506 and 508 in FIG. 5 are applicable to the operations 1404, 1406 and 1408.

Figure 15:
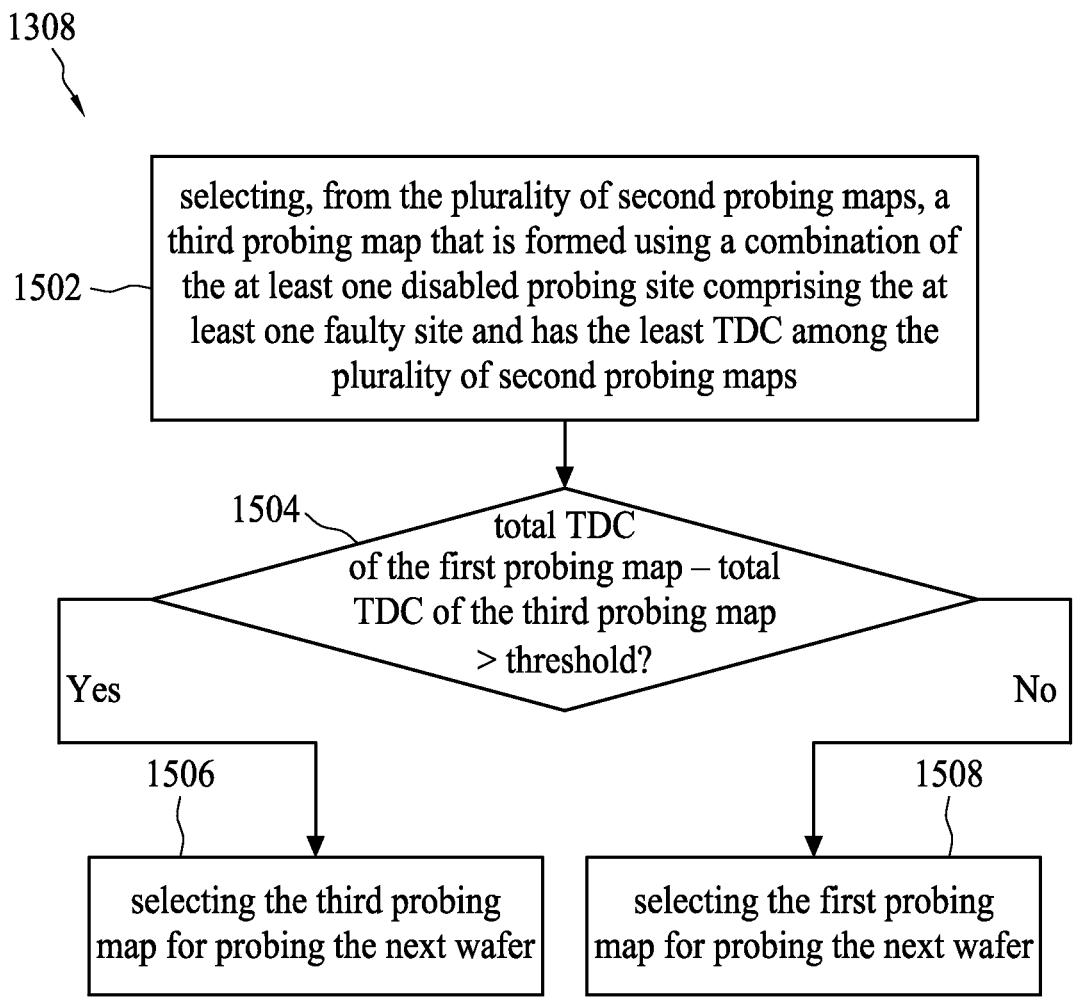
FIG. 15 is a flow diagram of a method for performing the operation 1308 in FIG. 13 in accordance with some embodiments.

FIG. 15 is a flow diagram of a method for performing the operation 1308 in FIG. 13 in accordance with some embodiments. In operation 1502, a third probing map that is formed using a combination of the at least one disabled probing site comprising the at least one faulty site and has the least TDC among the plurality of second probing maps is selected from the plurality of second probing maps. The operation 1502 corresponds to the operation 510 in FIG. 5 and the description for the operation 510 is applicable to the operation 1502. In operation 1504, whether a difference of a total TDC of the first probing map and a total TDC of the third probing map is greater than a threshold is determined. If so, the method proceeds to operation 1506 in which the third probing map is selected for probing the next wafer and if not, the method proceeds to operation 1508 in which the first probing map is selected for probing the next wafer. The operations 1504, 1506 and 1508 in FIG. 15 correspond to the operations 208, 210 and 212 in FIG. 2, respectively. In some embodiments, the total TDC of the first probing map is equal to FTDC+BLRTDC in expression (1), the total TDC of the third probing map is equal to STDC+BDRTDC in expression (1) and the threshold in operation 1504 corresponds to the threshold in expression (1).

Figure 16:
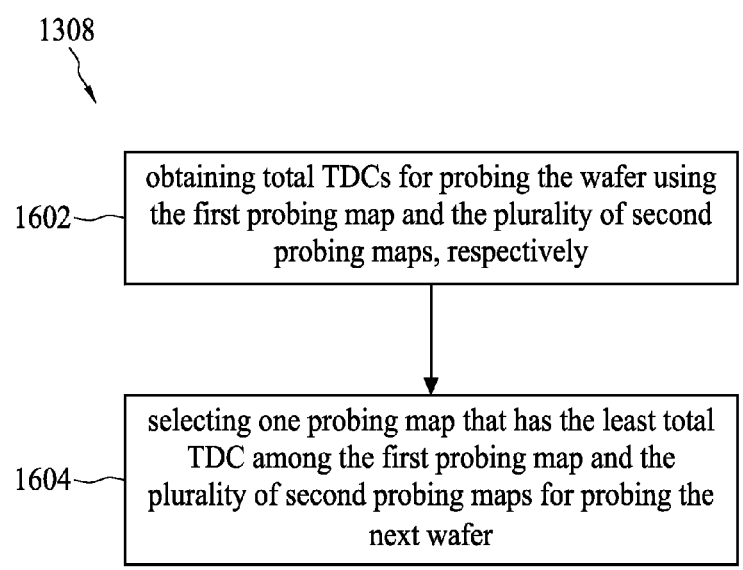
FIG. 16 is a flow diagram of a method for performing the operation 1308 in FIG. 13 in accordance with other embodiments.

FIG. 16 is a flow diagram of a method for performing the operation 1308 in FIG. 13 in accordance with other embodiments. Compared to the method in FIG. 15, total TDC for all of the first probing map and the plurality of second probing maps are obtained and the probing map that has the least total TDC is selected as the probing map for probing the next wafer. In operation 1602, the total TDC for probing the wafer using the first probing map and the plurality of second probing maps are obtained, respectively. In some embodiments, the total TDC of the first probing map is equal to FTDC+BLRTDC in expression (1) and the total TDC of each second probing map is equal to STDC+BDRTDC of the corresponding second probing map in expression (1).

As described with references to FIGS. 13 to 16, by generating a plurality of second probing maps corresponding to different combinations of the at least one disabled probing site and selecting, based on the total TDC obtained considering the first probing map and the plurality of second probing maps, a probing map for probing the next wafer, the probing map that results in less total TDC is selected from the first probing map and the plurality of second probing maps.

Figure 17A:
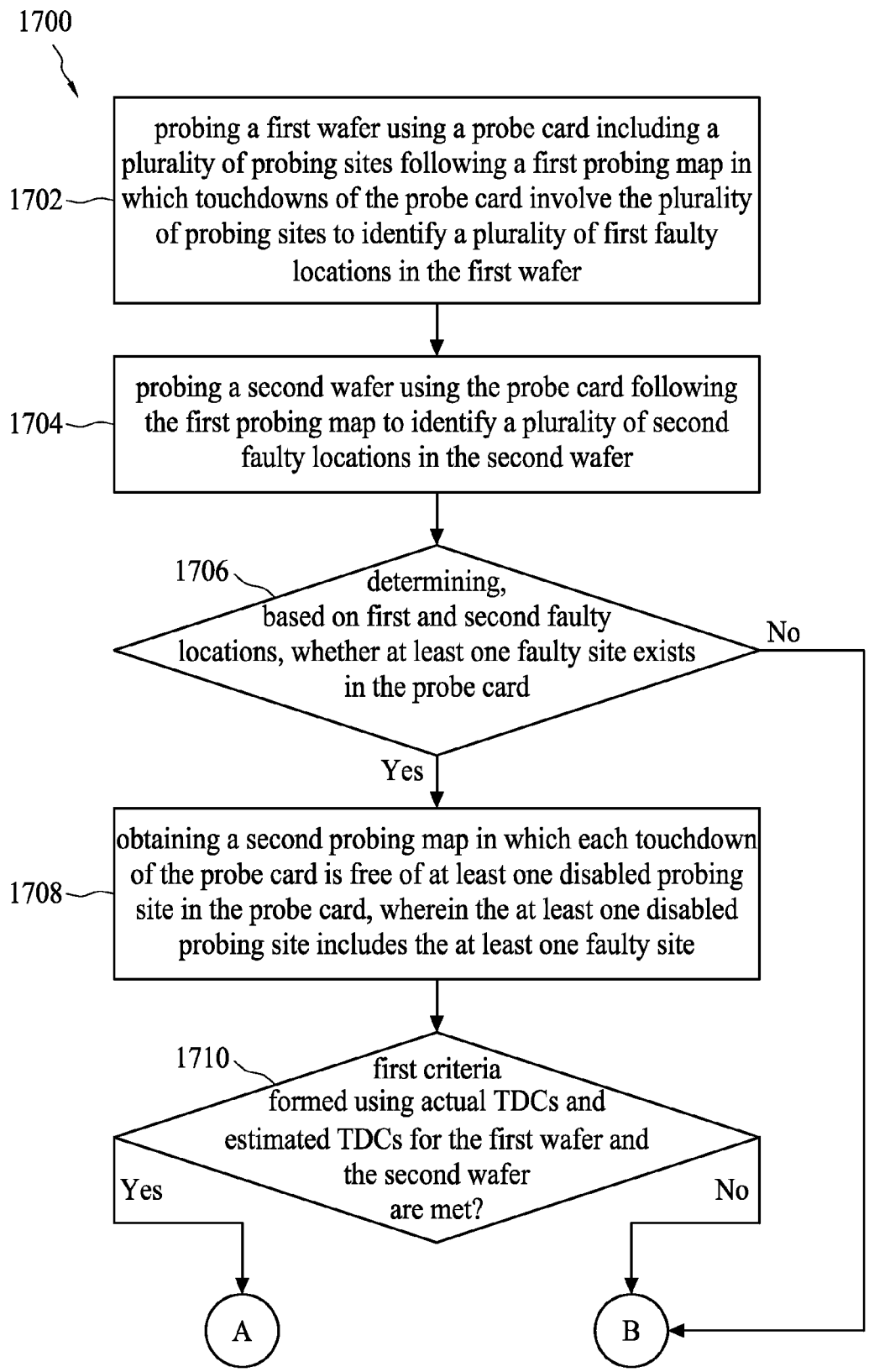
FIGS. 17A and 17B are a flow diagram of a method performed by the tester in FIG. 1 for generating the probing map in accordance with still other embodiments.
Figure 17B:
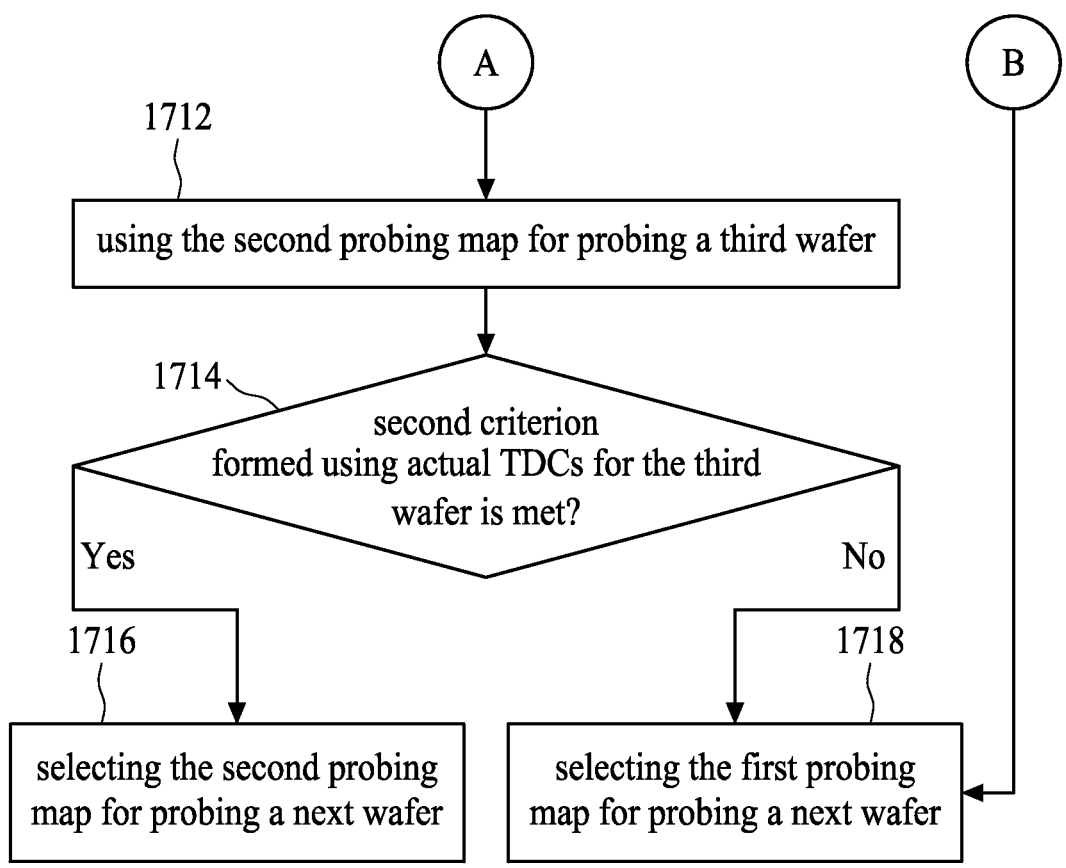

FIGS. 17A and 17B is a flow diagram of a method 1700 performed by the tester 130 in FIG. 1 for generating the probing map in accordance with still other embodiments. Compared to the method 200 in FIG. 2, the method 1700 further uses a second wafer for determining at least one faulty site in the probe card and forming first criteria for selecting a probing map for probing a third wafer, and further checks whether the third wafer probed using the selected probing map meets a second criterion to confirm selecting the probing map for probing a next wafer. In operation 1702, a first wafer is probed using a probe card including a plurality of probing sites following a first probing map in which touchdowns of the probe card involve the plurality of probing sites to identify a plurality of first faulty locations in the first wafer. In operation 1704, a second wafer is probed using the probe card following the first probing map to identify a plurality of second faulty locations in the second wafer. The operation 1702 corresponds to the operation 202 in FIG. 2 and the operation 1704 is similar to the operation 202. The description for the operation 202 is applicable to the operations 1702 and 1704.

In operation 1706, whether at least one faulty site exists in the probe card is determined based on the first faulty locations and the second faulty locations. If so, the method 1700 proceeds to operation 1708 and if not, the method proceeds to operation 1718. The operation 1706 corresponds to the operation 204 in FIG. 2. The description for obtaining the at least one faulty site based on the faulty locations for operation 204 is applicable for obtaining the at least one faulty site based on the first faulty locations and the second faulty locations for the operation 1706.

In operation 1708, a second probing map in which each touchdown of the probe card is free of at least one disabled probing site in the probe card is obtained. The at least one disabled probing site includes the at least one faulty site. The operation 1708 corresponds to the operation 206. The description for the operation 206 is applicable to the operation 1708.

In operation 1710, whether the first criteria formed using actual TDCs and estimated TDCs for the first wafer and the second wafer are met is determined. If so, the method 1700 proceeds to operation 1712 and if not, the method 1700 proceeds to operation 1718. The description for evaluating the first criterion formed using actual TDCs based on the first probing map and estimated TDCs based on the second probing map for the first wafer in operation 208 is applicable to evaluating the first criterion formed using the actual TDCs (corresponding to the first probing map) and the estimated TDCs (corresponding to the second probing map) for the first wafer and another first criterion formed using the actual TDCs and the estimated TDCs for the second wafer in operation 1710.

In operation 1712, the second probing map is used for probing the third wafer. In operation 1714, whether the second criterion formed using actual TDCs for the third wafer is met is determined. If so, the method 1700 proceeds to operation 1716 and if not, the method 1700 proceeds to operation 1718. In some embodiments, the second criterion is formed using the actual TDCs for probing the third wafer using the first probing map and for probing the third wafer using the second probing map. The description for evaluating the first criterion formed using actual TDCs based on the first probing map and estimated TDCs based on the second probing map for the first wafer in operation 208 is applicable to evaluating the second criterion formed using actual TDCs based on first probing map and actual TDCs based on the second probing map for the third wafer.

In operation 1716, the second probing map is selected for probing the next wafer. In operation 1718, the first probing map is selected for probing the next wafer. The operations 1716 and 1718 correspond to the operations 210 and 212, respectively. The description for the operations 210 and 212 is application to the operations 1716 and 1718.

Figure 18:
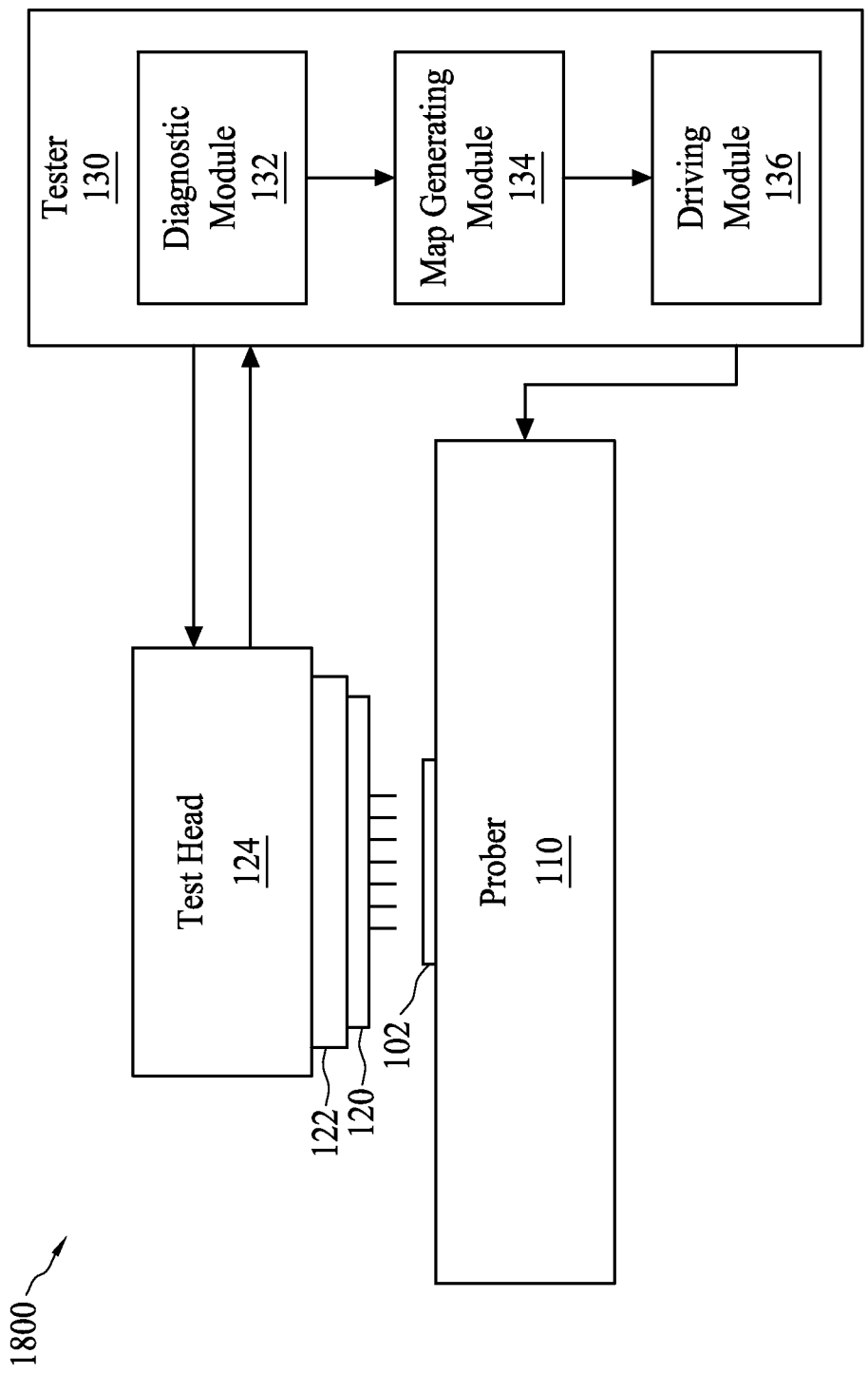
FIG. 18 is a schematic diagram of an ATE system in accordance with some embodiments.

FIG. 18 is a schematic diagram of an ATE system 1800 in accordance with some embodiments. Components of the ATE system 1800 that have the same reference numerals as those of the ATE system 100 in FIG. 1 are the same as those of the ATE system 100. In some embodiments, the tester 130 includes a diagnostic module 132, a map generating module 134 and a driving module 136. The driving module 136 is configured to cause a wafer 102 to be probed using the probe card 120 following a first probing map in which touchdowns of the probe card involve the plurality of probing sites to generate a first probe result. The description for the operation 202 in FIG. 2 is applicable to the driving module 136. The diagnostic module 132 is configured to identify a plurality of faulty locations of the wafer from the first probe result and determined whether at least one faulty site exists in the plurality of probing sites based on the faulty locations. The description for the operation 204 in FIG. 2 is applicable to the diagnostic module 132. The map generating module 134 is configured to obtain a second probing map in which each touchdown of the probe card is free of at least one disabled probing site in the plurality of probing sites. The at least one disabled probing site includes the at least one faulty site. The map generating module 134 is further configured to select the second probing map for the driving module to cause a second wafer to be probed using the second probing map when a first criterion formed using a first touchdown count in the first probing map, a second touchdown count in the second probing map, a third touchdown count determined based on re-probing the plurality of first faulty locations and a fourth touchdown count determined based on re-probing malfunctioning DUTs in the wafer is met. The description for the operations 206, 208, 210 and 212 in FIG. 2 is applicable to the map generating module 134.

Figure 19:
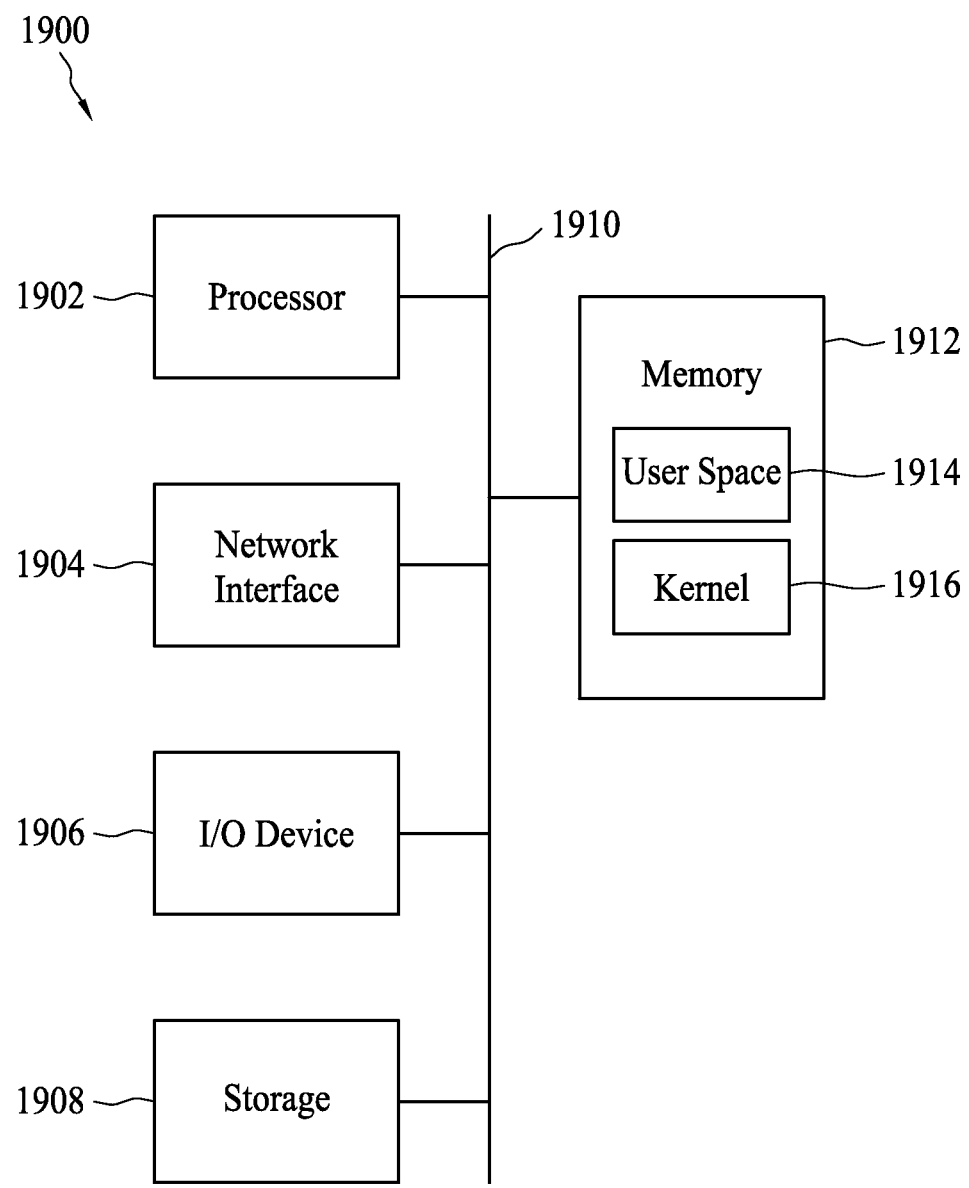
FIG. 19 is a block diagram of a hardware system in the tester in FIGS. 1 and 18 in accordance with some embodiments.

FIG. 19 is a block diagram of a hardware system 1900 in the tester 130 in FIGS. 1 and 18 in accordance with some embodiments. The system 1900 includes at least one processor 1902, a network interface 1904, an input and output (I/O) device 1906, a storage 1908, a memory 1912, and a bus 1910. The bus 1910 couples the network interface 1904, the I/O device 1906, the storage 1908 and the memory 1912 to the processor 1902.

In some embodiments, the memory 1912 comprises a random access memory (RAM) and/or other volatile storage device and/or read only memory (ROM) and/or other non-volatile storage device. The memory 1912 includes a kernel 1916 and user space 1914, configured to store program instructions to be executed by the processor 1902 and data accessed by the program instructions.

In some embodiments, the network interface 1904 is configured to access program instructions and data accessed by the program instructions stored remotely through a network. The I/O device 1906 includes an input device and an output device configured for enabling user interaction with the system 1900. The input device comprises, for example, a keyboard, a mouse, etc. The output device comprises, for example, a display, a printer, etc. The storage device 1908 is configured for storing program instructions and data accessed by the program instructions. The storage device 908 comprises, for example, a magnetic disk and an optical disk.

In some embodiments, when executing the program instructions, the processor 1902 is configured to perform the methods described with references to FIGS. 2 to 17 and configured as the modules described with reference to FIG. 18.

In some embodiments, the program instructions are stored in a non-transitory computer readable recording medium such as one or more optical disks, hard disks and non-volatile memory devices.

In some embodiments, in a method, a first wafer is probed using a probe card including a plurality of probing sites following a first probing map in which touchdowns of the probe card involve the plurality of probing sites to identify a plurality of first faulty locations in the first wafer. Whether at least one faulty site exists in the plurality of probing sites is determined based on the plurality of first faulty locations. When the at least one faulty site exists in the plurality of probing sites, a second probing map in which each touchdown of the probe card is free of at least one disabled probing site in the plurality of probing sites is obtained using at least one processor. The at least one disabled probing site includes the at least one faulty site. The second probing map is selected when a first criterion formed using a first touchdown count in the first probing map, a second touchdown count in the second probing map, a third touchdown count determined based on re-probing the plurality of first faulty locations and a fourth touchdown count determined based on re-probing a portion of the plurality of first faulty locations not induced by the at least one faulty site is met.

In some embodiments, in a method, a first wafer is probed using a probe card including a plurality of probing sites following a first probing map in which touchdowns of the probe card involve the plurality of probing sites to identify a plurality of first faulty locations in the first wafer. Whether at least one faulty exists in the plurality of probing sites is determined from the plurality of first faulty locations. When the at least one faulty site exists in the plurality of the probing sites, a plurality of second probing maps are obtained using at least one processor. Each of the plurality of second probing maps includes touchdowns of the probe card that is free of a different combination of at least one disabled probing site in the plurality of probing sites. A probing map is selected from the first probing map and the plurality of second probing maps to probe a second wafer.

In some embodiments, a system is configured to be coupled to a probe card including a plurality of probing sites. The probe card is configured to probe a first wafer. The system includes at least one processor and at least one memory. The at least one processor is configured to execute program instruction which configure the at least one processor as a driving module, a diagnostic module and map generating module. The driving module is configured to cause the first wafer to be probed using the probe card following a first probing map in which touchdowns of the probe card involve the plurality of probing sites to generate a first probe result. The diagnostic module is configured to identify a plurality of first faulty locations of the first wafer from the first probe result and determine whether at least one faulty site exists in the plurality of probing sites based on the first faulty locations. The map generating module is configured to perform first operations when the at least one faulty site exists in the plurality of probing sites. In the first operations, a second probing map in which each touchdown of the probe card is free of at least one disabled probing site in the plurality of probing sites is obtained. The at least one disabled probing site includes the at least one faulty site. The second probing map is selected for the driving module to cause a second wafer to be probed using the second probing map when a first criterion formed using a first touchdown count in the first probing map, a second touchdown count in the second probing map, a third touchdown count determined based on re-probing the plurality of first faulty locations and a fourth touchdown count determined based on re-probing a portion of the plurality of first faulty locations not induced by the at least one faulty site is met.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    probing a first wafer using a probe card comprising a plurality of probing sites following a first probing map in which touchdowns of the probe card involve the plurality of probing sites to identify a plurality of first faulty locations in the first wafer;
    determining, based on the plurality of first faulty locations, whether at least one faulty site exists in the plurality of probing sites;
    when the at least one faulty site exists in the plurality of probing sites,
        obtaining, using at least one processor, a second probing map in which each touchdown of the probe card is free of at least one disabled probing site in the plurality of probing sites, wherein the at least one disabled probing site comprises the at least one faulty site; and
    selecting the second probing map for probing a second wafer when a first criterion formed using a first touchdown count in the first probing map, a second touchdown count in the second probing map, a third touchdown count determined based on re-probing the plurality of first faulty locations and a fourth touchdown count determined based on re-probing a portion of the plurality of first faulty locations not induced by the at least one faulty site is met.

2. The method of claim 1, wherein the first criterion is $$FTDC-STDC+BLRTDC-BDRTDC > threshold$$

wherein FTDC is the first touchdown count, STDC is the second touchdown count, BLRTDC is the third touchdown count, BDRTDC is the fourth touchdown count and threshold is greater than or equal to zero.

3. The method of claim 2, wherein the third touchdown count equals the number of the faulty locations and the fourth touchdown count equals the number of the portion of the plurality of first faulty locations not induced by the at least one faulty site.

4. The method of claim 1, wherein obtaining, using the at least one processor, the second probing map comprises:
    obtaining a plurality of third probing maps corresponding to different combinations of the at least one disabled probing site in the plurality of probing sites; and
    selecting one of the plurality of third probing maps that is formed using a combination of the at least one disabled probing site comprising the at least one faulty site and has a less touchdown count among the plurality of third probing maps as the second probing map.

5. The method of claim 4, wherein obtaining the plurality of third probing maps corresponding to the different combinations of the at least one disabled probing site comprises
    for each of the plurality of third probing maps,
        generating a tree structure in which each level represents a device under test (DUT) in the first wafer and each node in the level represents a different probing site in the plurality of probing sites probing the DUT or a state that the DUT has been probed along with another DUT in a level upper than that of the DUT;

generating a plurality of fourth probing maps each of which corresponds to a path from a root node to a leaf node in the tree structure; and selecting one of the plurality of fourth probing maps that has a less touchdown count among the plurality of fourth probing maps as the third probing map.

6. The method of claim 4, wherein the different combinations of the at least one disabled probing site comprise at least one corner block of the plurality of probing sites.

7. The method of claim 1, further comprising:

probing a third wafer using the probe card following the first probing map to identify a plurality of second faulty locations in the third wafer;

determining, based on second faulty locations, whether the at least one faulty site exists in the plurality of probing sites.

8. The method of claim 7, wherein the second probing map is selected for probing the second wafer when the first criterion and a second criterion are met;

the second criterion is formed using the first touchdown count, the second touchdown count, a fifth touchdown count determined based on the second faulty locations and a sixth touchdown count determined based on re-probing a portion of the plurality of second faulty locations not induced by the at least.

9. A method, comprising:

probing a first wafer using a probe card comprising a plurality of probing sites following a first probing map in which touchdowns of the probe card involve the plurality of probing sites to identify a plurality of first faulty locations in the first wafer;

determining, from the plurality of first faulty locations, whether at least one faulty site exists in the plurality of probing sites;

when the at least one faulty site exists in the plurality of probing sites, obtaining, using at least one processor, a plurality of second probing maps, wherein each of the plurality of second probing maps comprises touchdowns of the probe card that is free of a different combination of at least one disabled probing site in the plurality of probing sites;

selecting, from the first probing map and the plurality of second probing maps, a probing map to probe a second wafer.

10. The method of claim 9, wherein obtaining the plurality of second probing maps comprises for each of the plurality of second probing maps, generating a tree structure in which each level represents a DUT in the first wafer and each node in the level represents a different probing site in the plurality of probing sites probing the DUT or a state that the DUT has been probed along with another DUT in a level upper than that of the DUT; and generating a plurality of third probing maps each of which corresponds to a path from a root node to a leaf node in the tree structure; and selecting one of the plurality of third probing maps that has a less touchdown count among the plurality of third probing maps as the second probing map.

11. The method of claim 9, wherein the different combinations of the at least one disabled probing site comprise at least one corner block of the plurality of probing sites.

12. The method of claim 9, wherein selecting, from the first probing map and the plurality of second probing maps, the probing map for probing the second wafer comprises:

selecting, from the plurality of second probing maps, a fourth probing map that is formed using a combination of the at least one disabled probing site comprising the at least one faulty site and has a less touchdown count among the plurality of second probing maps; and selecting, from the first probing map and the fourth probing map, the probing map for probing the second wafer.

13. The method of claim 12, wherein the fourth probing map is selected when a first total touchdown count for probing the first wafer using the first probing map is larger than a second total touchdown count for probing the first wafer using the fourth probing map by a threshold; and the threshold is greater than or equal to zero.

14. The method of claim 13, wherein the first total touchdown count for probing the first wafer using the first probing map is equal to a sum of a first touchdown count in the first probing map and a second touchdown count determined based on re-probing the plurality of first faulty locations; and the second total touchdown count for probing the first wafer using the fourth map is equal to a sum of a third touchdown count in the fourth probing map and a fourth touchdown count determined based on re-probing a portion of the plurality of first faulty locations not induced by the at least one faulty site.

15. The method of claim 14, wherein the second touchdown count equals the number of the faulty locations and the fourth touchdown count equals the number of the portion of the plurality of first faulty locations not induced by the at least one faulty site.

16. The method of claim 9, wherein selecting, from the first probing map and the plurality of second probing maps, the probing map for probing the second wafer comprises:

obtaining total touchdown counts for probing the first wafer s using the first probing map and the plurality of second probing maps, respectively; and selecting one probing map that has a less total touchdown count among the first probing map and the plurality of second probing maps for probing the second wafer.

17. A system, wherein the system is configured to be coupled to a probe card comprising a plurality of probing sites, the probe card is configured to probe a first wafer, and the system comprises:

at least one processor, configured to execute program instructions which configure the at least one processor as:

a driving module configured to cause the first wafer to be probed using the probe card following a first probing map in which touchdowns of the probe card involve the plurality of probing sites to generate a first probe result;

a diagnostic module configured to identify a plurality of first faulty locations of the first wafer from the first probe result and determine whether at least one faulty site exists in the plurality of probing sites based on the first faulty locations; and a map generating module configured to perform first operations when the at least one faulty site exists in the plurality of probing sites, wherein the first operations comprise:

obtaining a second probing map in which each touchdown of the probe card is free of at least one disabled probing site in the plurality of probing sites, the at least one disabled probing site comprising the at least one faulty site; and selecting the second probing map for the driving module to cause a second wafer to be probed using the second probing map when a first criterion formed using a first touchdown count in the first probing map, a second touchdown count in the second probing map, a third touchdown count determined based on re-probing the plurality of first faulty locations and a fourth touchdown count determined based on re-probing a portion of the plurality of first faulty locations not induced by the at least one faulty site is met; and at least one memory, configured to store the program instructions.

18. The system of claim 17, wherein the first criterion is $$FTDC-STDC+BLRTDC-BDRTDC>threshold$$

wherein FTDC is the first touchdown count, STDC is the second touchdown count, BLRTDC is the third touchdown count, BDRTDC is the fourth touchdown count and threshold is greater than or equal to zero.

19. The system of claim 18, wherein the third touchdown count equals the number of the faulty locations and the fourth touchdown count equals the number of the portion of the plurality of first faulty locations not induced by the at least one faulty site.

20. The system of claim 17, wherein the map generating module is configured to obtain the second probing map by:
    obtaining a plurality of third probing maps corresponding to different combinations of the at least one disabled probing site in the plurality of probing sites; and
    selecting one of the plurality of third probing maps that is formed using a combination of the at least one disabled probing site comprising the at least one faulty site and has a less touchdown count among the plurality of third probing maps as the second probing map.

* * * * *